(12) United States Patent
Shin et al.

(10) Patent No.: US 10,684,560 B2
(45) Date of Patent: *Jun. 16, 2020

(54) PELLICLE FOR PHOTOMASK, RETICLE INCLUDING THE SAME, AND EXPOSURE APPARATUS FOR LITHOGRAPHY

(71) Applicant: Samsung Electronics Co., Ltd., Suwon-si, Gyeonggi-do (KR)

(72) Inventors: Hyeonjin Shin, Suwon-si (KR); Hyunjae Song, Hwaseong-si (KR); Minhyun Lee, Yongin-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/917,947

(22) Filed: Mar. 12, 2018

(65) Prior Publication Data
US 2018/0259844 A1    Sep. 13, 2018

(30) Foreign Application Priority Data

Mar. 10, 2017   (KR) .......................... 10-2017-0030539

(51) Int. Cl.
*G03B 27/62* (2006.01)
*G03F 7/20* (2006.01)
(Continued)

(52) U.S. Cl.
CPC ............ *G03F 7/70983* (2013.01); *G03F 1/22* (2013.01); *G03F 1/62* (2013.01); *G03F 1/64* (2013.01);
(Continued)

(58) Field of Classification Search
CPC ..... G03F 1/62; G03F 1/64; G03F 1/66; G03F 1/22; G03F 7/70008; G03F 7/70283;
(Continued)

(56) References Cited

U.S. PATENT DOCUMENTS 7,524,616 B2   4/2009 Chen et al.
9,360,749 B2   6/2016 Lin et al.
(Continued)

FOREIGN PATENT DOCUMENTS

EP   2518563 A1   10/2012
EP   3007206 A1   4/2016
(Continued)

OTHER PUBLICATIONS

U.S. Appl. No. 15/807,106, filed Nov. 8, 2017.
(Continued)

*Primary Examiner* — Christina A Riddle
(74) *Attorney, Agent, or Firm* — Harness, Dickey & Pierce, P.L.C.

(57) ABSTRACT

A pellicle for a photomask, a reticle including the same, and an exposure apparatus for lithography are provided. The pellicle may include a pellicle membrane and a passivation member. The pellicle membrane may include a carbon-based material having defects. The passivation member may cover the defects of the carbon-based material. The passivation member may include an inorganic material. The passivation member may be disposed on one or two surfaces of the pellicle membrane. The pellicle for the photomask may be applied to extreme ultraviolet (EUV) lithography.

28 Claims, 22 Drawing Sheets

(51) Int. Cl.
*G03F 1/62* (2012.01)
*G03F 1/22* (2012.01)
*G03F 1/64* (2012.01)

(52) U.S. Cl.
CPC ........ *G03F 7/7095* (2013.01); *G03F 7/70283* (2013.01); *G03F 7/70958* (2013.01)

(58) Field of Classification Search
CPC ............... G03F 7/70983; G03F 7/7095; G03F 7/70958; G03F 7/702; G03F 7/70916
USPC ............... 355/30, 52, 53, 55, 67–71, 75, 77; 430/5, 271.1; 250/492.1, 492.2
See application file for complete search history.

(56) References Cited

U.S. PATENT DOCUMENTS

| | | |
|---|---|---|
| 9,703,186 B2 | 7/2017 | Kim et al. |
| 10,191,367 B2 | 1/2019 | Song et al. |
| 2010/0195076 A1* | 8/2010 | Mueller ................ G03F 1/64 355/67 |
| 2012/0321545 A1* | 12/2012 | Jeon ................ B82Y 40/00 423/448 |
| 2013/0088699 A1 | 4/2013 | Yakunin et al. |
| 2013/0250260 A1 | 9/2013 | Singh |
| 2014/0160455 A1 | 6/2014 | Yakunin et al. |
| 2015/0235959 A1* | 8/2015 | Lee ................ H01L 23/53276 257/762 |
| 2015/0309404 A1 | 10/2015 | Lin et al. |
| 2016/0139500 A1 | 5/2016 | Kim et al. |
| 2016/0147141 A1 | 5/2016 | Ono et al. |
| 2016/0148369 A1 | 5/2016 | Jeong et al. |
| 2016/0201201 A1 | 7/2016 | Kim et al. |
| 2017/0017150 A1 | 1/2017 | Yakunin et al. |
| 2017/0038675 A1 | 2/2017 | Ahn et al. |
| 2017/0090278 A1 | 3/2017 | Chiu |
| 2018/0149966 A1* | 5/2018 | Shin ................ G03F 1/62 |

FOREIGN PATENT DOCUMENTS

| | | |
|---|---|---|
| EP | 3151064 A2 | 4/2017 |
| EP | 3 330 796 A1 | 6/2018 |
| JP | 2001255644 A | 9/2001 |
| JP | 5788590 B2 | 9/2015 |
| KR | 10-2014-0038985 A | 3/2014 |
| KR | 20140027562 A | 3/2014 |
| KR | 20150121292 A | 10/2015 |
| KR | 10-2015-0123145 A | 11/2015 |
| KR | 10-2016-0058306 A | 5/2016 |
| KR | 20160086024 A | 7/2016 |
| KR | 101813185 B1 | 1/2018 |
| WO | WO-2005/029180 A2 | 3/2005 |
| WO | WO-2013/174656 A2 | 11/2013 |
| WO | WO-2017/067813 A2 | 4/2017 |

OTHER PUBLICATIONS

Vanpaemel, et al. "Alternative membrane development at imec" Aspire Invent Achieve, pp. 1-20 (2016).
Extended European Search Report dated Apr. 26, 2018 issued in corresponding European Application No. 17201726.1.
McConnell, et al. "Thermal Conductivity of Doped Polysilicon Layers," Journal of Microelectromechanical Systems, vol. 10, No. 3, pp. 360-369 (2001).
Korean Office Action dated May 8, 2017 issued in corresponding Korean Application No. 10-2018-0182297 (Eliglish translation provided).
Lee, J.U. et al., "Introducing the EUV CNT pellicle," Proceedings of the SPIE, vol. 9985, 2016.
Extended European Search Report for EP Appl. No. 17203361.5 dated Jul. 5, 2018.
Office Action dated Jun. 11, 2019, issued in co-pending U.S. Appl. No. 15/807,106.
Gao et al., "Extreme ultraviolet induced defects on few-layer graphene" Journal of Applied Physics, Jul. 2013 (DOI 10.1063.1/1.4817082).
Notice of Allowance dated Sep. 4, 2019, issued in corresponding U.S. Appl. No. 15/807,106.

* cited by examiner

# PELLICLE FOR PHOTOMASK, RETICLE INCLUDING THE SAME, AND EXPOSURE APPARATUS FOR LITHOGRAPHY

CROSS-REFERENCE TO RELATED APPLICATION

This application claims the benefit of Korean Patent Application No. 10-2017-0030539, filed on Mar. 10, 2017, in the Korean Intellectual Property Office, the disclosure of which is incorporated herein in its entirety by reference.

BACKGROUND

1. Field

The present disclosure relates to a pellicle for a photomask, a reticle including the same, and an exposure apparatus for lithography.

2. Description of Related Art

A pellicle for a photomask may be provided in the form of a film on a photomask so as to protect the photomask from external contaminants (for example, dust, resist, or the like) during optical lithography. Such a pellicle may have high transmittance with respect to light used in a lithography process. Such a pellicle may have certain characteristics such as heat dissipation characteristics, strength, uniformity, durability, stability, and the like. As features in semiconductor devices and electronic circuits have become smaller, a wavelength of light used in a lithography process may become shorter. Different pellicle materials are being developed.

SUMMARY

Provided is a pellicle for a photomask, the pellicle having high light transmittance and excellent characteristics in various aspects.

Provided is a pellicle for a photomask, the pellicle having excellent durability and stability.

Provided is a pellicle for a photomask, the pellicle having excellent characteristics in terms of thermal conductivity, uniformity, strength, and the like.

Provided is a pellicle for a photomask, the pellicle having high transmittance and excellent resistance and durability with respect to short-wavelength light such as extreme ultraviolet (EUV) light.

Provided is a reticle including the pellicle.

Provided is a lithography apparatus to which the reticle including the pellicle is applied.

Additional aspects will be set forth in part in the description which follows and, in part, will be apparent from the description, or may be learned by practice of the presented embodiments.

According to some example embodiments, a pellicle for protecting a photomask includes a pellicle membrane including a carbon-based material having defects and a passivation member covering the defects of the carbon-based material and including an inorganic material.

In some example embodiments, the carbon-based material may include at least one of graphene, nanocrystalline graphene, reduced graphene oxide (rGO), carbon nanotube (CNT), fullerene, or amorphous carbon.

In some example embodiments, the defects of the carbon-based material may include at least one of a grain boundary, a vacancy, an sp3 carbon (C) atom, an oxygen (O) atom, or a nitrogen (N) atom.

In some example embodiments, the carbon-based material may include at least one of graphene, CNT, and fullerene, which may be formed by a growth or synthesis method, and the defects of the carbon-based material may include at least one of a grain boundary or a vacancy.

In some example embodiments, the carbon-based material may include nanocrystalline graphene. In this case, a D/G intensity ratio in a Raman spectrum of the nanocrystalline graphene may be about 0.5 or more, and a 2D/G intensity ratio in the Raman spectrum of the nanocrystalline graphene may be about 0.05 or more.

In some example embodiments, an amount of oxygen (O) in the nanocrystalline graphene may be in a range of about 1 at % to about 20 at %.

In some example embodiments, an amount of hydrogen (H) in the nanocrystalline graphene may be in a range of about 1 at % to about 20 at %.

In some example embodiments, an amount of nitrogen (N) in the nanocrystalline graphene may be in a range of about 1 at % to about 20 at %.

In some example embodiments, the passivation member may include a plurality of dot elements.

In some example embodiments, the plurality of dot elements may selectively cover the defects of the carbon-based material.

In some example embodiments, the passivation member may have a thin film structure.

In some example embodiments, the passivation member may be on at least one of an upper surface of the pellicle membrane or a lower surface of the pellicle membrane.

In some example embodiments, the inorganic material of the passivation member may include at least one of a metal, an oxide, a nitride, a semiconductor, or a metal chalcogenide-based material.

In some example embodiments, the metal may include at least one of Mo, Ti, or Ru.

In some example embodiments, the oxide may include $MoO_x$.

In some example embodiments, the nitride may include at least one of TiN or $SiN_x$.

In some example embodiments, the semiconductor may include at least one of Ge or $ZrSi_2$.

In some example embodiments, the metal chalcogenide-based material may include a transition metal chalcogenide.

In some example embodiments, the passivation member may have a thickness within about 20% of a thickness of the pellicle membrane. The passivation member may have a thickness within about 10% of a thickness of the pellicle membrane.

In some example embodiments, the passivation member may have a thickness of about 20 nm or less. The passivation member may have a thickness of about 10 nm or less.

In some example embodiments, the pellicle membrane may have a thickness of about 100 nm or less.

In some example embodiments, each of the pellicle membrane and the passivation member may have a transmittance of about 80% or more with respect to EUV light.

In some example embodiments, the pellicle membrane may be spaced apart from the photomask by about 1 mm to about 10 mm.

In some example embodiments, the pellicle may further include a pellicle frame on an edge portion of the pellicle membrane.

In some example embodiments, the pellicle may further include a bonding layer between the pellicle membrane and the pellicle frame.

According to some example embodiments, a reticle includes: a photomask; and the above-described pellicle configured to protect the photomask. The pellicle may be connected to the photomask.

In some example embodiments, the reticle may be a transmissive reticle.

In some example embodiments, the reticle may be a reflective reticle.

In some example embodiments, the reticle may be a reticle for EUV lithography.

In some example embodiments, an exposure apparatus for lithography includes a light source configured to generate light, and the above-discussed reticle disposed in a traveling path of the light generated by the light source.

In some example embodiments, the exposure apparatus may further include a first optical member between the reticle and the light source and/or a second optical member between the reticle and a substrate.

In some example embodiments, the exposure apparatus may be an EUV exposure apparatus.

According to some example embodiments, a pellicle for protecting a photomask includes a pellicle membrane, a frame, and a passivation member. The pellicle membrane includes a carbon-based material. The carbon-based material has defects. The frame supports the pellicle membrane. The passivation member may be on top of at least one of the frame and the pellicle membrane. The passivation member covers the defects of the carbon-based material. The passivation member includes an inorganic material.

In some example embodiments, the carbon-based material may include at least one of graphene, nanocrystalline graphene, reduced graphene oxide (rGO), carbon nanotube (CNT), fullerene, or amorphous carbon.

In some example embodiments, the passivation layer may include a first passivation layer and a second passivation layer. The first passivation layer may be between the frame and the pellicle membrane. The second passivation layer may be on top of the pellicle membrane and the frame.

In some example embodiments, the inorganic material may include at least one of Mo, Ti, Ru, $MoO_x$, TiN, $SiN_x$, Ge, $ZrSi_2$, or a transition metal chalcogenide.

In some example embodiments, a reticle may include the photomask and the above-discussed pellicle. The pellicle may be connected to the photomask and configured to protect the photomask.

In some example embodiments, an exposure apparatus for lithography includes a light source configured to generate light, and the above-discussed reticle disposed in a traveling path of the light generated by the light source.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
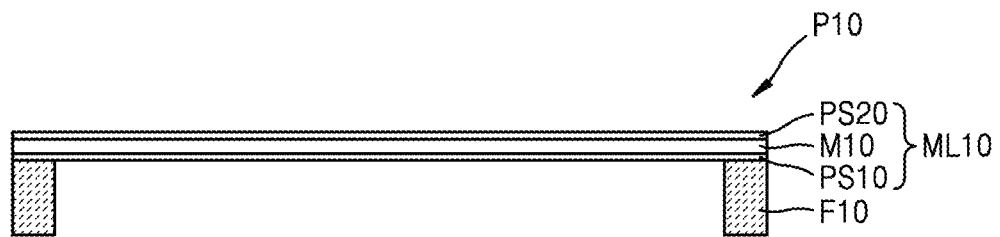
FIG. 1 is a cross-sectional view of a pellicle for a photomask, according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, pellicles for photomasks, reticles including the same, and exposure apparatuses for lithography, according to embodiments, will be described in detail with reference to the accompanying drawings. Widths and thicknesses of layers or regions in the drawings may be exaggerated for clarity and convenience of explanation. Like reference numerals are assigned to like elements throughout the drawings and the specification.

FIG. 1 is a cross-sectional view of a pellicle P10 for a photomask, according to some example embodiments.

Referring to FIG. 1, the pellicle P10 may include a pellicle membrane M10. The pellicle membrane M10 may include a carbon-based material having defects. In other words, a constituent material (or a main constituent material) of the pellicle membrane M10 may be a carbon-based material. The carbon-based material may include a two-dimensional (2D) carbon structure or a carbon-based nanomaterial. For example, the carbon-based material may include at least one selected from graphene, nanocrystalline graphene, reduced graphene oxide (rGO), carbon nanotube (CNT), fullerene, and amorphous carbon. The defects of the carbon-based material may include at least one selected from an sp3 carbon (C) atom, an oxygen (O) atom, a nitrogen (N) atom, and a carbon vacancy. Also, the defects may have various forms, for example, a point defect or a line defect such as a grain boundary.

The pellicle P10 may include at least one passivation member, for example, passivation members PS10 and PS20 covering the defects of the carbon-based material. The at least one passivation member may be disposed on at least one of a first surface (e.g., a lower surface) and a second surface (e.g., an upper surface) of the pellicle membrane M10. FIG. 1 illustrates a case where the first passivation member PS10 is disposed on the lower surface of the pellicle membrane M10, and the second passivation member PS20 is disposed on the upper surface of the pellicle membrane M10. Each of the passivation members PS10 and PS20 may include an inorganic material. The passivation members PS10 and PS20 may serve to suppress or prevent a problem in which characteristics of the pellicle membrane M10 are degraded by light or gas. The light may include extreme ultraviolet (EUV) light, and the gas may include $H_2$. The inorganic material may be a material that is stable in an environment in which EUV energy or $H_2$ gas is used. Therefore, the passivation members PS10 and PS20 including the inorganic material may serve to suppress or prevent the pellicle membrane M10 from being degenerated or degraded by light or gas. In particular, defective regions of the pellicle membrane M10 may be degenerated or degraded relatively easily. Due to the use of the passivation members PS10 and PS20, such a problem may be suppressed or prevented.

The inorganic material of the passivation members PS10 and PS20 may be a material that has high transmittance and excellent resistance and durability with respect to short-wavelength light such as EUV light. Also, the inorganic material may be a material that has relatively excellent strength and uniformity and is prepared by a relatively simple method. For example, the inorganic material may include at least one selected from a metal, an oxide, a nitride, a semiconductor, and a metal chalcogenide-based material. As a specific example, the metal may include at least one selected from Mo, Ti, and Ru. The oxide may be a metal oxide and may include, for example, molybdenum oxide ($MoO_x$). The nitride may be a metal nitride or a non-metal nitride and may include, for example, at least one selected from titanium nitride (TiN) and silicon nitride ($SiN_x$). The semiconductor may include, for example, at least one selected from Ge and zirconium silicide (e.g., $ZrSi_2$). The metal chalcogenide-based material may include a transition metal chalcogenide, and the transition metal chalcogenide may include a transition metal dichalcogenide (TMD). The above-described materials may have high transmittance and excellent resistance and durability with respect to short-wavelength light such as EUV light and may also have excellent strength and uniformity. However, specific materials and kinds of the inorganic material are not limited to those described above and may be changed. For example, the metal may further include Zr or the like, and the semiconductor may further include Si or the like. Various other materials may be applied to the passivation members PS10 and PS20. The passivation members PS10 and PS20 may include the same material or may include at least one different material from each other.

The pellicle membrane M10 may have a thickness of greater than 0 nm and about 100 nm or less. For example, the pellicle membrane M10 may have a thickness of about 70 nm or less, or about 50 nm or less. The pellicle membrane M10 may have a transmittance of about 80% or more, or about 90% or more, with respect to EUV light. Each of the first and second passivation members PS10 and PS20 may have a thickness less than that of the pellicle membrane M10. For example, each of the first and second passivation members PS10 and PS20 may have a thickness within about 20% or about 10% of a thickness of the pellicle membrane M10. For example, each of the first and second passivation members PS10 and PS20 may have a thickness of about 20 nm or less, about 10 nm or less, or about 5 nm or less. Each of the first and second passivation members PS10 and PS20 may have a transmittance of about 80% or more, or about 90% or more, with respect to EUV light. Each of the first and second passivation members PS10 and PS20 may have a transmittance that is less than or equal to about 100% with respect to EUV light. A case where each of the first and second passivation members PS10 and PS20 has a thickness less than that of the pellicle membrane M10 is advantageous in securing transmittance and thickness uniformity. At least one of the first and second passivation members PS10 and PS20 may be a thin film-type passivation member or an island-type passivation member including a plurality of dot elements.

The pellicle membrane M10 and the passivation members PS10 and PS20 may be collectively referred to as a membrane layer ML10. That is, the pellicle membrane M10 and the passivation members PS10 and PS20 may constitute the membrane layer ML10. The membrane layer ML10 may be referred to as a "membrane structure". The membrane layer ML10 may have a transmittance of about 80% or more, or about 90% or more, with respect to EUV light.

The pellicle P10 may further include a pellicle frame F10 so as to support the pellicle membrane M10. Due to the pellicle frame F10, the pellicle membrane M10 may be spaced apart from a photomask (not illustrated) by a certain interval. The pellicle frame F10 may be disposed at an edge portion of the pellicle membrane M10. When viewed from above, the pellicle frame F10 may have a rectangular or circular frame structure or other various shapes. The first passivation member PS10 may be disposed between the pellicle membrane M10 and the pellicle frame F10. In a process of forming the pellicle frame F10, the first passivation member PS10 may serve to protect the pellicle membrane M10.

The case where the first and second passivation members PS10 and PS20 are disposed on two sides of the pellicle membrane M10 is illustrated in FIG. 1, but in some embodiments, one of the passivation members may be disposed at only one side of the pellicle membrane M10. Examples thereof are illustrated in FIGS. 2 and 3.

Figure 2:
FIG. 2 is a cross-sectional view of a pellicle for a photomask, according to some example embodiments.
Figure 3:
FIG. 3 is a cross-sectional view of a pellicle for a photomask, according to some example embodiments.

As illustrated in FIG. 2, the passivation member PS10 may be disposed on one surface of the pellicle membrane M10, for example, the lower surface of the pellicle membrane M10. Also, as illustrated in FIG. 3, the passivation member PS20 may be disposed on another surface of the pellicle membrane M10, for example, the upper surface of the pellicle membrane M10. Even though the passivation member PS10 or PS20 is disposed on only one side of the pellicle membrane M10, the passivation member PS10 or P20 may protect the pellicle membrane M10.

In FIG. 2, the pellicle membrane M10 and the passivation member PS10 may constitute a membrane layer ML11, and the membrane layer ML11 and the pellicle frame F10 may constitute a pellicle P11 for a photomask. Similarly, in FIG. 3, the pellicle membrane M10 and the passivation member PS20 may constitute a membrane layer ML12, and the membrane layer ML12 and the pellicle frame F10 may constitute a pellicle P12 for a photomask.

Figure 4:
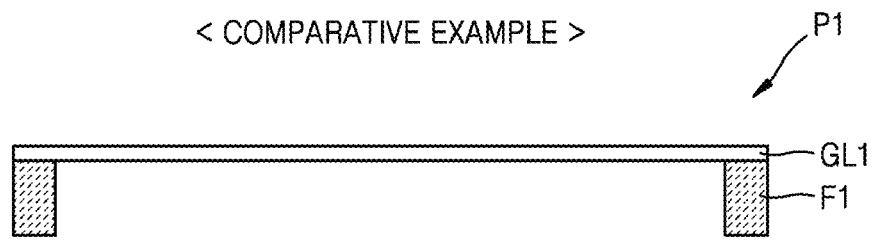
FIG. 4 is a cross-sectional view of a pellicle for a photomask, according to a comparative example.

FIG. 4 is a cross-sectional view of a pellicle P1 for a photomask, according to a comparative example.

Referring to FIG. 4, the pellicle P1 according to the comparative example may include a pellicle membrane GL1 including a graphene layer. That is, the pellicle membrane GL1 may be a graphene layer. The pellicle membrane GL1 may not include the passivation members PS10 and PS20 described above with reference to FIGS. 1 to 3. A pellicle frame F1 supports the pellicle membrane GL1.

When the pellicle P1 of FIG. 4 according to the comparative example is used, the pellicle P1 may be easily degenerated and degraded by EUV light or EUV light+$H_2$. This will be described below with reference to FIG. 5.

Figure 5:
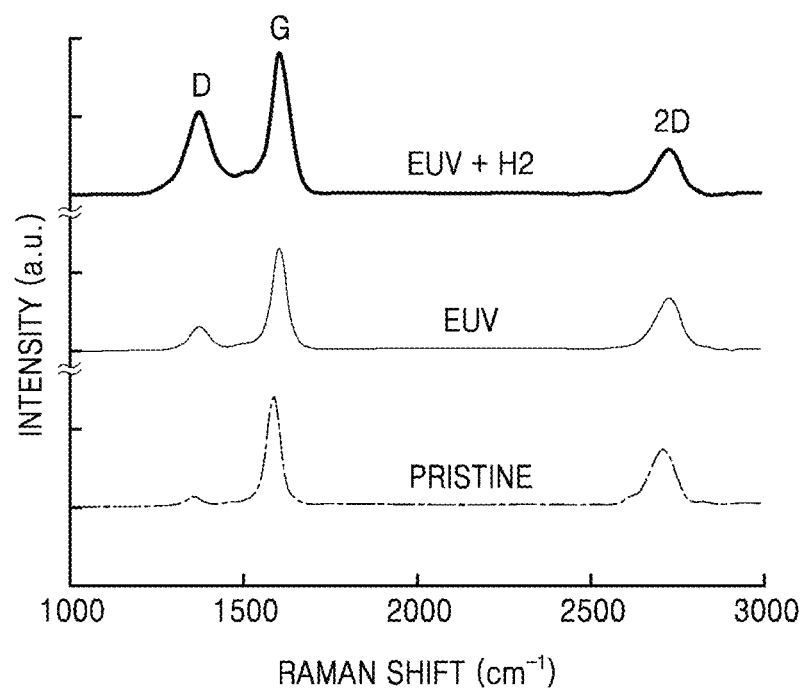
FIG. 5 shows a result of Raman spectroscopy analysis of a change in properties when a pellicle according to a comparative example is exposed to extreme ultraviolet (EUV) light and EUV light+$H_2$.

FIG. 5 shows a result of Raman spectroscopy analysis of a change in properties when the pellicle P1 according to the comparative example was exposed to EUV light and EUV light+$H_2$. For example, FIG. 5 shows Raman spectroscopy plots of a case where the pellicle P1 was in a pristine state, a case where the pellicle P1 was exposed to EUV light, and a case where the pellicle P1 was exposed to EUV light+$H_2$. In FIG. 5, D peak is a peak appearing at about 1,340 $cm^{-1}$ to about 1,350 $cm^{-1}$, G peak is a peak appearing at about 1,580 $cm^{-1}$, and 2D peak is a peak appearing at about 2,700 $cm^{-1}$.

Referring to FIG. 5, it can be seen that the heights and ratios of peaks were changed in the case of exposure to EUV light and EUV light+$H_2$, as compared with the pristine state. In particular, it can be seen that the D peak changed greatly. In the case of exposure to EUV light, the height of the D peak was increased, and in the case of exposure to EUV light+$H_2$, the height of the D peak was more greatly increased. This means that characteristics of the pellicle membrane (GL1 in FIG. 4) (that is, the graphene layer) were degenerated and degraded by EUV light and EUV light+$H_2$. As the pellicle membrane (graphene layer) is exposed to EUV light and EUV light+$H_2$, the pellicle membrane (graphene layer) may be gradually etched and characteristics of the pellicle membrane (graphene layer), such as transmittance, may be changed. Such a problem may be caused by a defective region of the pellicle membrane (graphene layer).

Figure 6:
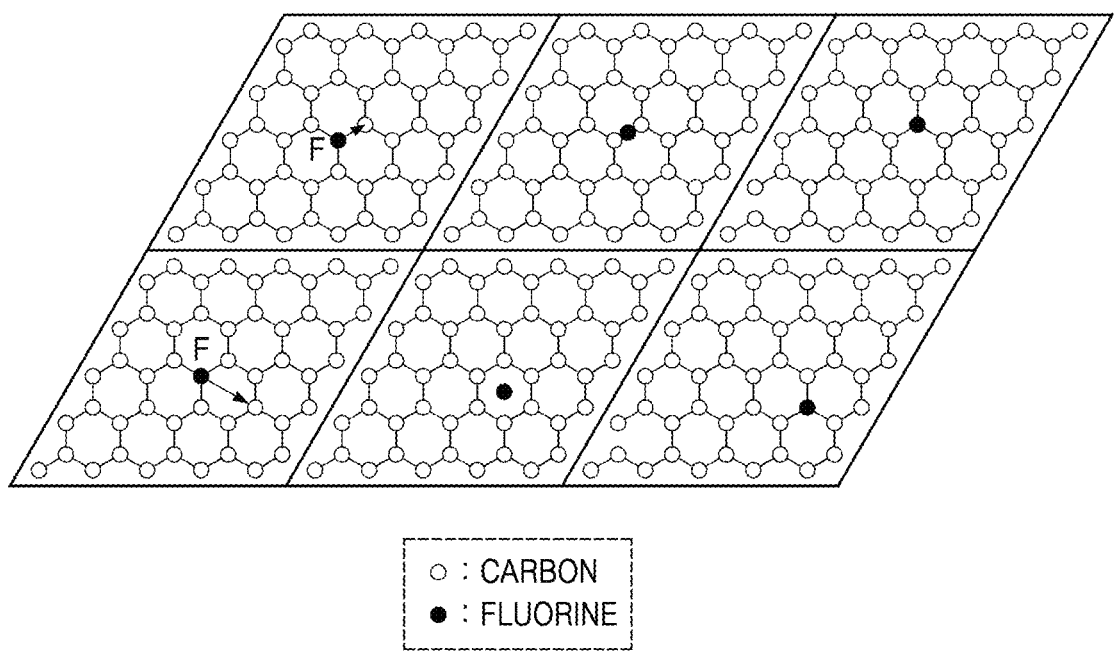
FIG. 6 is a diagram illustrating a case where a fluorine atom is adsorbed onto an internal region other than a graphene edge and then migrates.

FIG. 6 is a diagram illustrating a case where a fluorine (F) atom is adsorbed onto an internal region other than a graphene edge and then migrates.

Referring to FIG. 6, the fluorine (F) atom may be adsorbed onto the internal region other than the graphene edge and may not migrate easily. Energy required for the migration of the fluorine (F) atom may be about 5.5 kcal/mol or more. Therefore, the internal region of graphene may have very low reactivity. In other words, the internal region of graphene may have relatively excellent stability.

Figure 7:
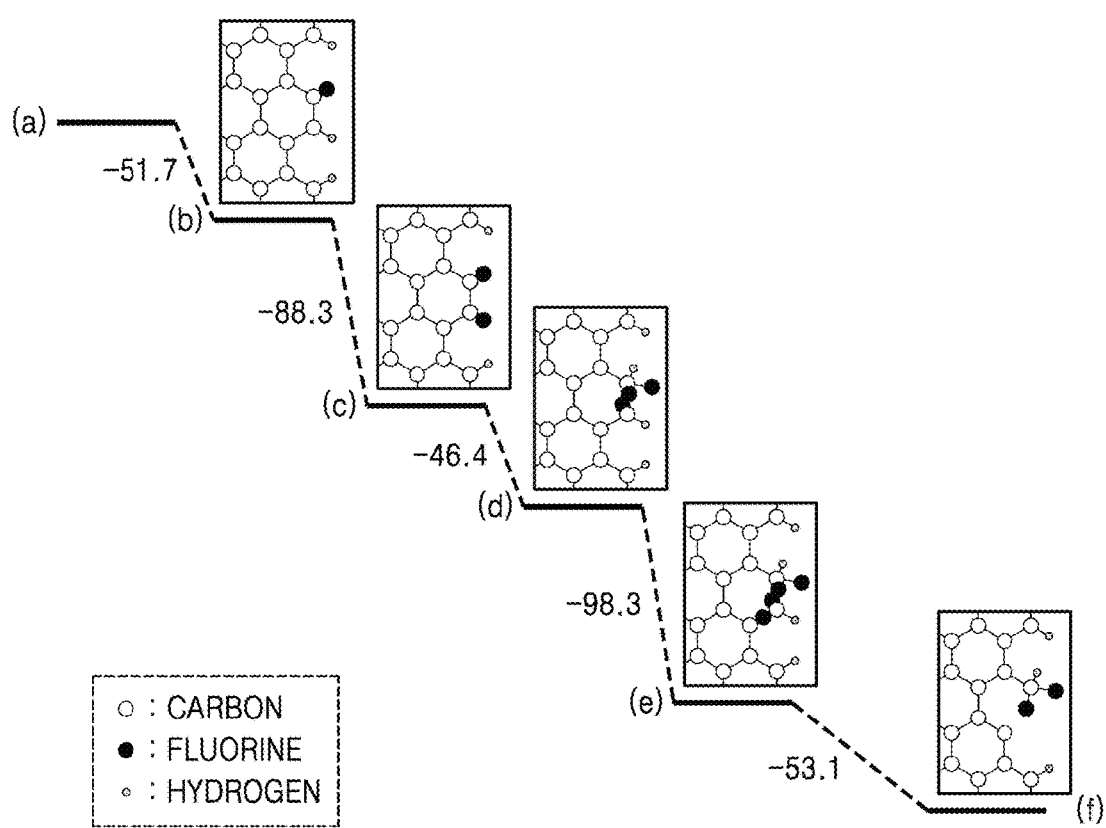
FIG. 7 is a diagram illustrating a case where a fluorine atom is adsorbed onto a graphene edge portion and then undergoes a reaction.

FIG. 7 is a diagram illustrating a case where a fluorine atom is adsorbed onto a graphene edge portion and then undergoes a reaction.

Referring to FIG. 7, the fluorine (F) atom may be well adsorbed onto the graphene edge portion and undergo a reaction. Energy required to change from an (a) state to a (b) state may be about −51.7 kcal/mol. The (a) state is a state in which no fluorine (F) atom is adsorbed onto a graphene edge, and the (b) state is a state in which one fluorine (F) atom is adsorbed onto a graphene edge. That the energy required to change from the (a) state to the (b) state is a negative (−) value means that such a reaction can easily occur. Energies required to change from the (b) state to a (c) state, from the (c) state to a (d) state, from the (d) state to an (e) state, and from the (e) state to an (f) state may all have a negative value. In particular, breakage of C-C bonds occurs in the process of changing from the (c) state to the (d) state. Energy required at this time may be about −46.4 kcal/mol, and this may be an exothermic reaction. As such, the graphene edge region, e.g., the defective region, may have relatively high reactivity with an external atom, and degeneration and degradation may easily progress therein.

FIGS. 6 and 7 illustrate an example in which the fluorine (F) atom is adsorbed and undergoes a reaction, and a type of an atom that is adsorbed and undergoes a reaction may be variously changed. Also, the positive (+) or negative (−) energies described with reference to FIGS. 6 and 7 are based on simulation and may be different from actual energies.

Figure 8:
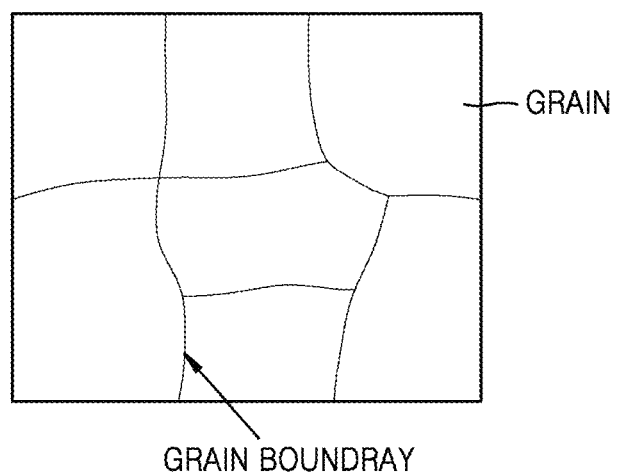
FIG. 8 is a plan view illustrating an example of a planar form of a graphene layer.

FIG. 8 is a plan view illustrating an example of a planar form of a graphene layer.

Referring to FIG. 8, the graphene layer may have a plurality of crystal grains and a grain boundary therebetween. The grain boundary may be a type of a graphene edge. The graphene layer may not have a monocrystalline structure as a whole and may include a plurality of crystal grains and a grain boundary therebetween.

Figure 9:
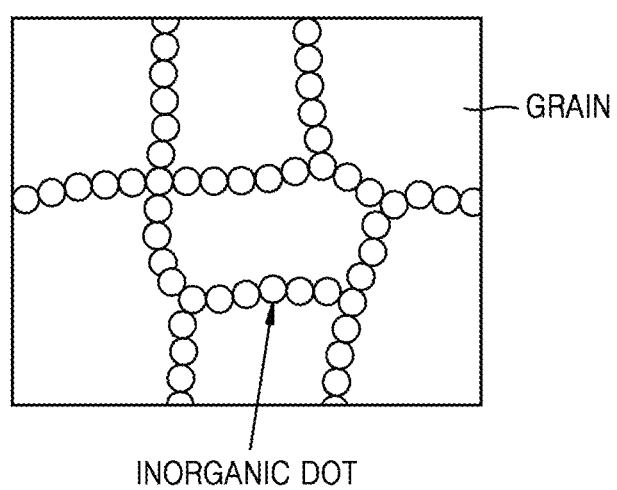
FIG. 9 is a plan view illustrating a case where a plurality of dot elements covering a grain boundary are formed on the graphene layer of FIG. 8.

FIG. 9 is a plan view illustrating an example in which a plurality of dot elements covering the grain boundary are formed on the graphene layer of FIG. 8.

Referring to FIG. 9, the dot elements covering the grain boundary may be formed on the graphene layer. The dot elements may include an inorganic material and may be formed along the grain boundary. The dot elements may be an example of the passivation member PS10 or PS20 described above with reference to FIG. 1. The dot elements may selectively cover the defective region of the graphene layer, that is, the grain boundary. In forming the dot elements, since the internal region of graphene of the graphene layer has hydrophobicity and low reactivity and the grain boundary region has relatively high reactivity, the dot elements may be formed along the grain boundary region. These dot elements may serve to protect the graphene layer from light and gas used in a lithography process. Each of the dot elements may have a size (diameter) of tens of nm or less, but in some embodiments, may have a size (diameter) of about 100 nm or more.

Figure 10:
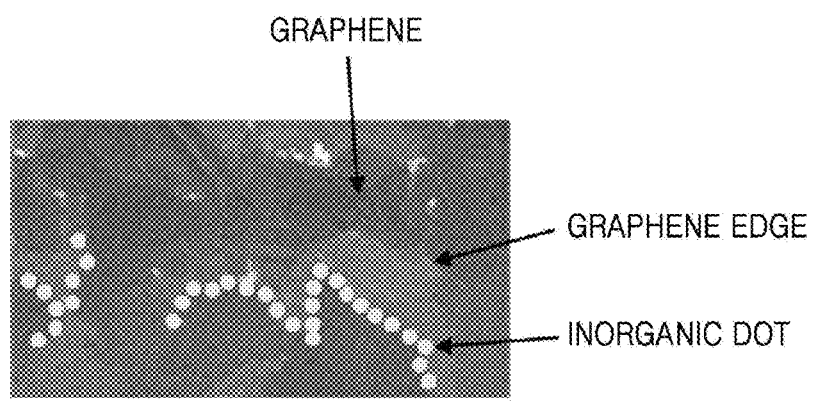
FIG. 10 is a scanning electron microscope (SEM) image showing a case where a plurality of dot elements are formed on a graphene layer along a grain boundary.

FIG. 10 is a scanning electron microscope (SEM) image showing a case where a plurality of dot elements are formed on a graphene layer along a grain boundary.

Referring to FIG. 10, a plurality of inorganic dots may be formed along a graphene edge, that is, a grain boundary.

According to some example embodiments, the passivation member may not be a multi-dot type but a thin film type. One example thereof is illustrated in FIG. 11.

Figure 11:
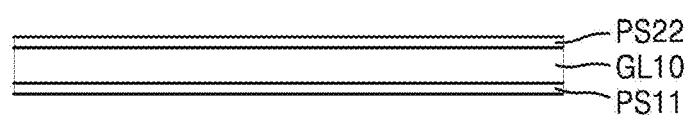
FIG. 11 is a cross-sectional view of a pellicle for a photomask, according to some example embodiments.

FIG. 11 is a cross-sectional view for describing a pellicle for a photomask, according to some example embodiments. Referring to FIG. 11, the pellicle may include thin film-type passivation layers PS11 and PS22 on a graphene layer GL10. The passivation layers PS11 and PS22 may be disposed on one or two surfaces of the graphene layer GL10. FIG. 11 illustrates a case where first and second passivation layers PS11 and PS22 are disposed on two surfaces of the graphene layer GL10. The passivation layers PS11 and PS22 may have a continuous layer shape. The thin film-type passivation layers PS11 and PS22 may be formed according to a process or condition for forming the passivation layers PS11 and PS22. Each of the passivation layers PS11 and PS22 may have a thickness less than that of the graphene layer GL10. Each of the passivation layers PS11 and PS22 may have a thickness within about 20% or about 10% of a thickness of the graphene layer GL10. For example, each of the passivation layers PS11 and PS22 may have a thickness of about 20 nm or less, about 10 nm or less, or about 5 nm or less. The graphene layer GL10 may be an example of the pellicle membrane.

A carbon-based material formed by a growth or synthesis method may include defects. For example, graphene, CNT, or fullerene formed by the growth or synthesis method may have defects such as a grain boundary or a vacancy. The vacancy may be a carbon vacancy. Also, the carbon-based material formed by the growth or synthesis method may include, as the defects, at least one selected from an oxygen (O) atom, a nitrogen (N) atom, and a hydrogen (H) atom. In the case of synthesizing the CNT, acid treatment may be performed in a refining process after synthesis, and defects may be generated by the acid treatment. Since such defects of the carbon-based material have good reactivity, the protection provided by the passivation member may be advantageous in limiting and/or preventing degeneration and degradation. The passivation members PS11 and PS22 may include the same material or may include at least one different material from each other.

A method of forming the dot-type passivation members (that is, inorganic dots) of FIGS. 9 and 10 and the thin film-type passivation members (passivation layers) of FIG. 11 will be described below. The passivation members according to some example embodiments may be formed by using a deposition process or a solution process. The deposition process may be chemical vapor deposition (CVD), atomic layer deposition (ALD), or physical vapor deposition (PVD). The solution process may be performed by coating a solution including a source material on a membrane (for example, a graphene layer) and performing a drying and/or annealing process thereon. The coating method may be, for example, spin coating. Dot-type passivation members or thin film-type passivation members may be formed according to a type or a specific condition of the deposition process or the solution process. For example, since the internal region of graphene of the membrane (e.g., the graphene layer) has hydrophobicity and low reactivity and the grain boundary region has relatively high reactivity, the dot-type passivation member may be formed along the grain boundary region. Also, dot-type passivation members or thin film-type passivation members may be formed according to a concentration of the source material included in the solution used in the solution process. However, the above-described method of forming the passivation members is merely an example and may be changed.

The pellicle membranes M10 of FIGS. 1 to 3 may include, for example, nanocrystalline graphene. Hereinafter, nanocrystalline graphene, which may be included in the pellicle membrane M10, will be described in detail with reference to FIGS. 12 and 13A to 13E.

Figure 12:
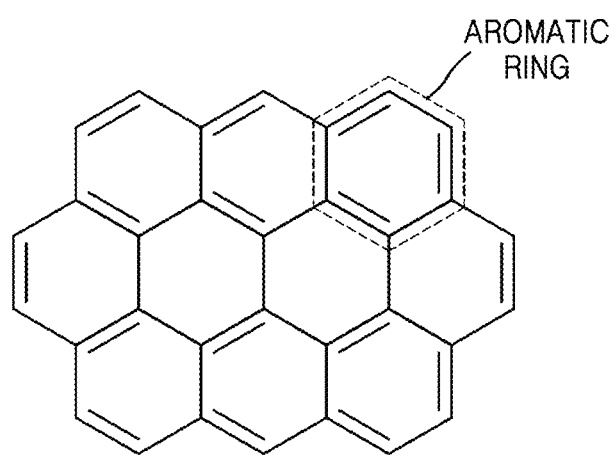
FIG. 12 illustrates a chemical structure of a crystal grain of nanocrystalline graphene applicable to a pellicle membrane according to some example embodiments.

FIG. 12 illustrates a chemical structure of a crystal grain of nanocrystalline graphene applicable to a pellicle membrane M10 of FIGS. 1 to 3. In the case of FIG. 12, it is assumed that the crystal grain does not include any defects, but an actual crystal grain may include defect(s).

Referring to FIG. 12, the crystal grain may include a "2D carbon structure" having an aromatic ring structure. Carbon atoms may form an aromatic ring structure, and such ring structures (annular structures) may be two-dimensionally arranged. A size of the crystal grain may be nanoscale. A size (length/diameter) of the crystal grain may be several hundreds of nm or less, for example, about 100 nm or less. The size, shape, and structure of the crystal grain illustrated in FIG. 12 are merely examples and may be variously changed. Possible defects of the crystal grain will be described with reference to FIGS. 13A to 13E.

FIGS. 13A to 13E illustrate chemical structures for describing various possible defects of the nanocrystalline graphene applicable to the pellicle membrane M10 of FIGS. 1 to 3. In other words, FIGS. 13A to 13E illustrate possible defects of the crystal grain of FIG. 12.

Figure 13A:
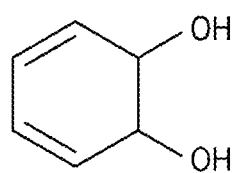
FIGS. 13A to 13E illustrate chemical structures for describing various possible defects of nanocrystalline graphene applicable to a pellicle membrane according to some example embodiments.

FIG. 13A illustrates a case where some carbon atoms forming an aromatic ring structure become sp3 carbons when double bonds thereof are broken, and hydroxy groups (OH) are bonded to the sp3 carbons. Carbon atoms maintaining double bonds in the aromatic ring structure may be referred to as sp2 carbons. Since all carbon atoms constituting general graphene may be sp2 carbons, the sp3 carbons may be regarded as defects of graphene. Also, a functional group (or a substituent) such as the hydroxy group (OH) bonded to the sp3 carbon may be regarded as defects.

Figure 13B:
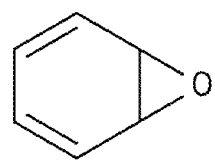

FIG. 13B illustrates a case where some carbon atoms forming an aromatic ring structure become sp3 carbons when double bonds thereof are broken, and an oxygen (O) atom is bonded to the sp3 carbons. The oxygen (O) atom may be bonded to two adjacent sp3 carbons. Such an oxygen (O) atom may be referred to as an epoxy group.

Figure 13C:
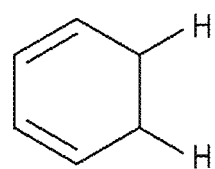

FIG. 13C illustrates a case where some carbon atoms forming an aromatic ring structure become sp3 carbons when double bonds thereof are broken, and hydrogen (H) atoms are bonded to the sp3 carbons. In some cases, a hydrogen (H) atom may be bonded to one of the two adjacent sp3 carbons, and a hydroxy group (OH) may be bonded to the other.

Figure 13D:
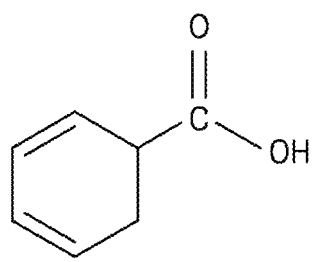

FIG. 13D illustrates a case where some carbon atoms forming an aromatic ring structure become sp3 carbons when double bonds thereof are broken, and a carboxyl group (COOH) is bonded to the sp3 carbon. Since the carboxyl group (COOH) may include a carbonyl group (C=O), it can also be said that the carbonyl group (C=O) is bonded to the sp3 carbon.

Figure 13E:
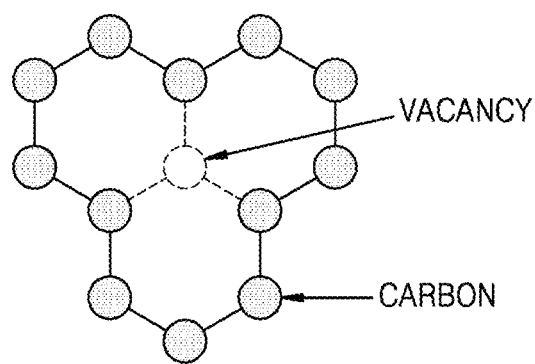

FIG. 13E illustrates a case where a carbon vacancy is generated in a 2D carbon structure having an aromatic ring structure. It can be said that FIGS. 13A to 13D illustrate a case where a functional group (or a substituent) or other atoms (atoms except for carbon) are bonded to the sp3 carbon, and FIG. 13E illustrates a case where a carbon vacancy is generated without a functional group (or a substituent).

Various types of defects described with reference to FIGS. 13A to 13E may be applied to the crystal grain illustrated in FIG. 12. In other words, various types of defects may be included in the nanocrystalline graphene constituting the pellicle membrane M10 of FIGS. 1 to 3. However, such defects described with reference to FIGS. 13A to 13E are merely examples and other types of defects may also be present. For example, the defects may include a nitrogen (N) atom. In this case, the nitrogen atom may be bonded to the sp3 carbon in the form of $NH_2$. In other words, in FIG. 13A, $NH_2$ instead of OH may be bonded to the sp3 carbon. At least two of the nitrogen atom and the various types of defects described with reference to FIGS. 13A to 13E may be included in one nanocrystalline graphene or one crystal grain. Also, defects other than the above-described defects may be present.

Defects of the nanocrystalline graphene may include at least one selected from an sp3 carbon atom, an oxygen atom, a nitrogen atom, and a carbon vacancy. Herein, the oxygen atom may be the oxygen atom included in OH of FIG. 13A, the oxygen atom of FIG. 13B, or the oxygen atom included in COOH of FIG. 13D, or may also be present in various forms. The nitrogen atom may be included in the form of, for example, $NH_2$, or may also be included in various forms. Also, the hydrogen (H) atoms included OH of FIG. 13A, H of FIG. 13C, and COOH of FIG. 13D may be regarded as defects. An amount (content) of hydrogen (H) in the nanocrystalline graphene may be larger than that in general graphene (for example, monocrystalline graphene). In a case where sheet-type monocrystalline graphene has defects at an edge portion thereof (however, the graphene may not have defects at the edge portion thereof), a very small amount of hydrogen (H) may be present only at the edge portion. An amount of hydrogen (H) in the nanocrystalline graphene may be larger than that in the monocrystalline graphene.

However, an amount of hydrogen (H) in the nanocrystalline graphene may be smaller than that in an amorphous carbon layer (ACL). An amount of hydrogen (H) in the ACL may be about 23.6 at %, and an amount of hydrogen (H) in the nanocrystalline graphene may be smaller than about 23.6 at %.

An amount (content) of oxygen (O) in the nanocrystalline graphene described with reference to FIGS. 1 to 13E may be in a range of about 12 at % to about 40 at %. For example, an amount of oxygen (O) in the nanocrystalline graphene may be in a range of about 1 at % to about 20 at %, or about 1 at % to about 10 at %. An amount (content) of hydrogen (H) in the nanocrystalline graphene may be in a range of about 1 at % to about 25 at %. For example, an amount of hydrogen (H) in the nanocrystalline graphene may be in a range of about 1 at % to about 20 at %. In a case where the nanocrystalline graphene includes nitrogen (N), an amount (content) of nitrogen (N) in the nanocrystalline graphene may be in a range of about 1 at % to about 30 at %. For example, an amount of nitrogen (N) in the nanocrystalline graphene may be in a range of about 1 at % to about 20 at %. However, the nanocrystalline graphene may contain about 1 at % or less of nitrogen (N) or may not contain nitrogen (N).

On the other hand, in a Raman spectrum of the nanocrystalline graphene, an intensity ratio of D peak to G peak, e.g., a D/G intensity ratio, may be about 0.5 or more. The G peak is a peak appearing at about 1,580 $cm^{-1}$. The G peak may be caused in a vibration mode corresponding to stretching of a carbon-carbon bond and provide information capable of determining the inclusion or non-inclusion of an aromatic ring structure. The D peak is a peak appearing in a range of about 1,340 $cm^{-1}$ to about 1,350 $cm^{-1}$. The D peak may be generated by defects such as an sp3 carbon and a carbon vacancy. In the Raman spectrum of the nanocrystalline graphene, the D/G intensity ratio may be about 0.5 or more. The D/G intensity ratio may be about 1 or more. The D/G intensity ratio may be about 2 or less.

In the Raman spectrum of the nanocrystalline graphene, an intensity ratio of 2D peak to G peak, e.g., a 2D/G intensity ratio, may be about 0.05 or more. The 2D peak is a peak appearing at about 2,700 $cm^{-1}$ and provides information capable of determining an amount of an aromatic ring structure. The 2D/G intensity ratio may be about 0.05 or more. For example, the 2D/G intensity ratio may be about 0.1 or more. The 2D/G intensity ratio may be about 1 or less. However, in some cases, the 2D/G intensity ratio may be greater than about 1. Conditions related to the Raman spectrum of the nanocrystalline graphene according to the embodiment will be described below with reference to FIG. 16 and the like.

Figure 14:
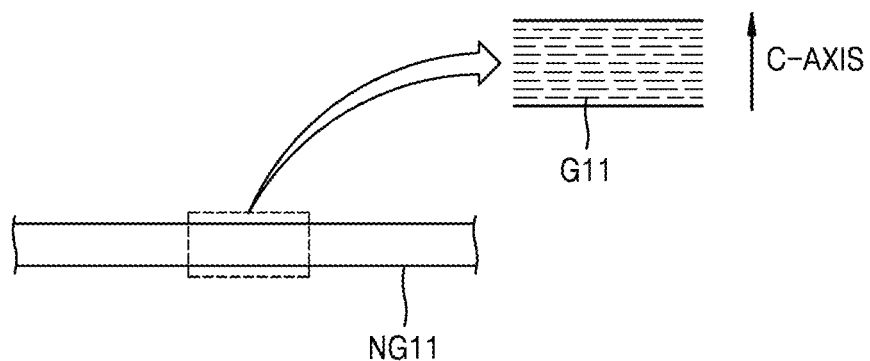
FIG. 14 is a cross-sectional view for describing a layer structure of nanocrystalline graphene applicable to a pellicle membrane for a photomask, according to some example embodiments.

FIG. 14 is a cross-sectional view for describing a layer structure of nanocrystalline graphene NG11 applicable to a pellicle membrane for a photomask, according to some example embodiments.

Referring to FIG. 14, the nanocrystalline graphene NG11 applicable to the pellicle may include a plurality of crystal grains G11. A size (length/diameter) of each of the crystal grains G11 may be several hundreds of nm or less, for example, about 100 nm or less. The crystal grains G11 may be roughly arranged (aligned) in a direction parallel to the nanocrystalline graphene NG11. The nanocrystalline graphene NG11 may have an irregular lattice structure in a vertical direction, that is, a C-axis direction. In other words, the crystal grains G11 may not have a regular or ordered lattice structure, such as graphite, in the C-axis direction. However, the crystal grains G11 may have a regular (or relatively regular) lattice structure in the C-axis direction in some regions of the nanocrystalline graphene NG11. Even in this case, the crystal grains G11 may have an irregular lattice structure in the C-axis direction in another region of the nanocrystalline graphene NG11. Therefore, when taking into account the entire regions, the nanocrystalline graphene NG11 may be said to have an irregular lattice structure in the C-axis direction.

An interlayer spacing, e.g., a d-spacing of the nanocrystalline graphene NG11 may be greater than a d-spacing of graphite. In other words, the d-spacing of the nanocrystalline graphene NG11 may be greater than about 3.35 Å. For example, the d-spacing of the nanocrystalline graphene NG11 may be about 3.4 Å or more. The d-spacing may be obtained by X-ray diffraction analysis. The nanocrystalline graphene NG11 may have an increased d-spacing since the nanocrystalline graphene NG11 has a nanocrystalline structure and includes defects.

Figure 15:
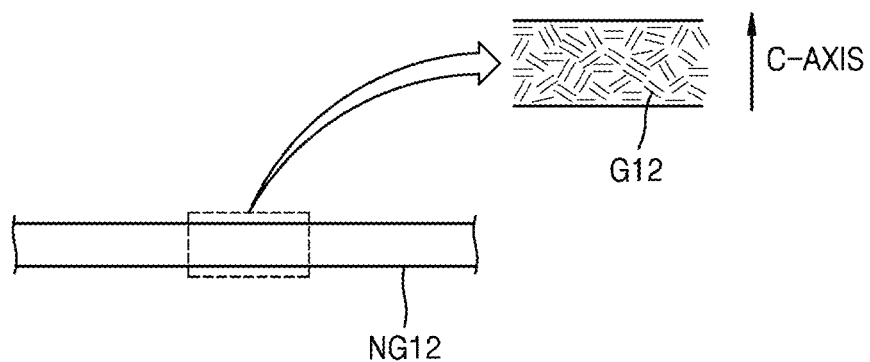
FIG. 15 is a cross-sectional view for describing a layer structure of nanocrystalline graphene applicable to a pellicle membrane for a photomask, according to some example embodiments.

FIG. 15 is a cross-sectional view for describing a layer structure of nanocrystalline graphene NG12 applicable to a pellicle membrane for a photomask, according to some example embodiments.

Referring to FIG. 15, the nanocrystalline graphene NG12 applicable to the pellicle may include a plurality of crystal grains G12. A size (length/diameter) of each of the crystal grains G12 may be several hundreds of nm or less, for example, about 100 nm or less. The crystal grains G12 may be arranged in a random direction or a relatively random direction. Therefore, the nanocrystalline graphene NG12 may have an irregular lattice structure in a C-axis direction. However, the crystal grains G12 may have a regular (or relatively regular) lattice structure in the C-axis direction in some regions (fine regions) of the nanocrystalline graphene NG12. A d-spacing of the nanocrystalline graphene NG12, as obtained through X-ray diffraction analysis, may be greater than about 3.35 Å. For example, the d-spacing of the nanocrystalline graphene NG12 may be about 3.4 Å or more.

A density of the nanocrystalline graphenes NG11 and NG12 may be less than a density of graphite. For example, the density of the nanocrystalline graphenes NG11 and NG12 may be less than about 2.2 $g/cm^3$. The density of the nanocrystalline graphenes NG11 and NG12 may be less than about 2.15 $g/cm^3$. In some cases, the density of the nanocrystalline graphenes NG11 and NG12 may be less than about 2.0 $g/cm^3$. The density of the nanocrystalline graphenes NG11 and NG12 may be greater than a density of an amorphous carbon layer (ACL). In this regard, the density of the nanocrystalline graphenes NG11 and NG12 may be greater than about 1.5 $g/cm^3$. Thus, the density of the nanocrystalline graphenes NG11 and NG12 may be greater than about 1.5 $g/cm^3$ and less than about 2.2 $g/cm^3$.

The layer structures of the nanocrystalline graphenes NG11 and NG12 described with reference to FIGS. 14 and 15 are merely examples and may be variously changed. The structures of FIGS. 14 and 15 may be mixed. Also, one of a lower layer region and an upper layer region of one nanocrystalline graphene may have the structure of FIG. 14, and the other may have the structure of FIG. 15. Other various structures may be applied to the nanocrystalline graphenes NG11 and NG12.

The nanocrystalline graphenes NG11 and NG12 may be formed by using various methods. For example, the nanocrystalline graphenes NG11 and NG12 may be formed by using a deposition process, such as chemical vapor deposition (CVD) or a solution process using a graphene-containing solution. Next, the method of forming the nanocrystalline graphenes NG11 and NG12 by using the deposition process and the solution process will be described in detail.

Nanocrystalline graphene may be formed by using the deposition process such as CVD. The CVD may be thermal CVD or plasma CVD. Examples of the plasma CVD may include inductively coupled plasma CVD (ICP-CVD) and plasma enhanced CVD (PE-CVD). The CVD may use a gas source or a solid source (for example, a source of carbon). The solid source may include polymer, organic monomer, or the like. The nanocrystalline graphene may be formed by adjusting a type (material) of a substrate and a process temperature (deposition temperature) in the deposition process. Also, in forming the nanocrystalline graphene, an amount or type of defects included in the nanocrystalline graphene may be adjusted by additionally using defect-causing materials. Unlike amorphous carbon, the nanocrystalline graphene has crystallinity. However, the crystallinity of the nanocrystalline graphene NG1 may be lower than that of graphite or monocrystalline graphene. Also, various characteristics may be exhibited by defects included in the nanocrystalline graphene.

Next, the method of forming the nanocrystalline graphene by using a solution process will be described in detail. A graphene-containing solution may be prepared by dissolving graphene particles, each having a size of several tens of nm or less, in a certain solvent. A film may be formed by coating the solution on a certain substrate (underlayer). Then, nanocrystalline graphene may be formed from the film by performing annealing or heat treatment on the film. The graphene particles may be graphene quantum dots (GQDs) or graphene nanoplates. Also, graphene oxide particles may be used instead of the graphene particles or together with the graphene particles. The solvent may include at least one selected from N-methylpyrrolidone (NMP), dimethylformamide (DMF), and $NH_4OH$, but inventive concepts are not limited thereto. The process of coating the solvent on the substrate (underlayer) may be performed by using various coating methods or film casting methods. The annealing or heat treatment may be performed on the film coated on the substrate (underlayer) at a temperature lower than about 2,000° C. For example, the annealing or heat treatment may be performed at a temperature of about 1,200° C. or lower, but may be performed at a temperature higher than about 1,200° C. The nanocrystalline graphene may be formed in the above-described manner. Crystallinity or defects of the nanocrystalline graphene may be adjusted by controlling the temperature or atmosphere of the annealing or heat treatment. In some cases, defect-causing materials may be additionally used.

The nanocrystalline graphene formed in the above-described manner may have excellent uniformity. The nanocrystalline graphene may have excellent thickness uniformity and surface uniformity. For example, the surface roughness of the nanocrystalline graphene may be less than about 10 nm. The surface roughness of the nanocrystalline graphene may be about 6 nm or less, or about 3 nm or less. The nanocrystalline graphene may show uniform light transmittance as a whole. Therefore, when the nanocrystalline graphene is used in a pellicle membrane for lithography, uniformity and precision of the lithography process may be easily secured.

Also, the nanocrystalline graphene may have high transmittance with respect to a certain wavelength range of light. For example, the nanocrystalline graphene may have a transmittance of about 80% or more, or about 90% or more, with respect to extreme ultraviolet (EUV) light. The nanocrystalline graphene may have a transmittance of about 80% or more, or about 90% or more, with respect to EUV light in a thickness range of about 5 nm to about 100 nm. The nanocrystalline graphene may be usefully applied to an EUV lithography apparatus.

Also, the nanocrystalline graphene may have high thermal conductivity, excellent heat dissipation characteristics, excellent EUV resistance, and excellent mechanical strength (tensile strength). For example, the nanocrystalline graphene may have an in-plane thermal conductivity of several thousands of W/m·k, a Young's modulus of several hundreds of GPa or more, and a tensile strength of several tens of GPa or more, or about 100 GPa or more. Compared with poly-Si that has an in-plane thermal conductivity of about 15 W/m·k to about 35 W/m·k, a Young's modulus of about 170 GPa, and a tensile strength of about 1.5 GPa, the nanocrystalline graphene may have excellent characteristics as a material of the pellicle membrane in various aspects. Also, the nanocrystalline graphene may have excellent durability and stability.

When the nanocrystalline graphene is applied to the pellicle membrane M10 of FIGS. 1 to 3, the nanocrystalline graphene may have a thickness of about 100 nm or less. In other words, the pellicle membrane M10 including the nanocrystalline graphene may have a thickness of about 100 nm or less. For example, the nanocrystalline graphene may have a thickness of about 50 nm or less. The nanocrystalline graphene may have a transmittance of about 80% or more, or about 90% or more, with respect to EUV light.

Figure 16:
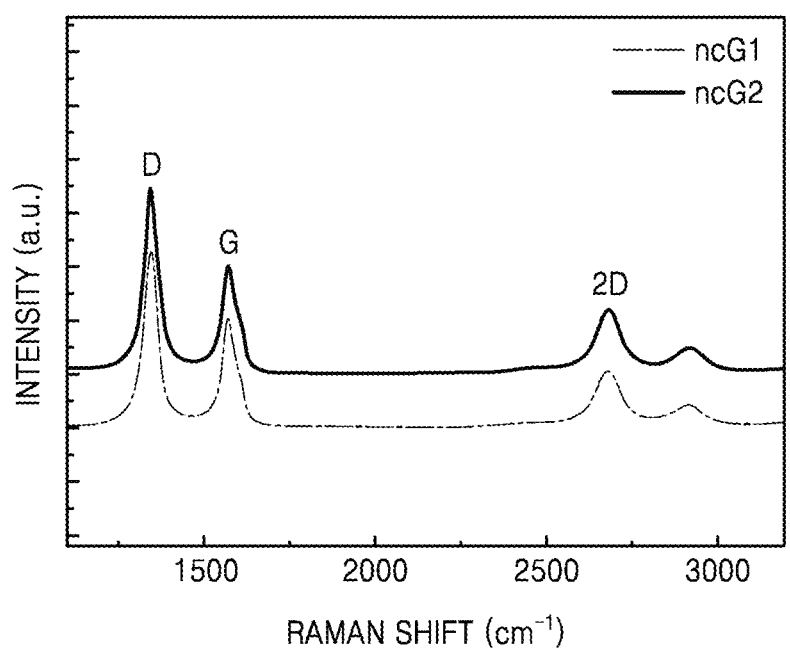
FIG. 16 is a graph showing a result of Raman spectroscopy analysis of nanocrystalline graphene, according to embodiments.

FIG. 16 is a graph showing a result of Raman spectroscopy analysis of nanocrystalline graphene, according to embodiments. In FIG. 16, nanocrystalline graphene ncG1 and nanocrystalline graphene ncG2 were formed by a deposition process. The nanocrystalline graphene ncG1 differs from the nanocrystalline graphene ncG2 in terms of a process temperature. The nanocrystalline graphene ncG1 was formed at a process temperature of 560° C., and the nanocrystalline graphene ncG2 was formed at a process temperature of 590° C.

Referring to FIG. 16, it can be seen that G peak, D peak, and 2D peak appear in a Raman spectrum. A D/G intensity ratio may be about 0.5 or more. The D/G intensity ratio may be about 1 or more. The D/G intensity ratio may be about 2 or less. A 2D/G intensity ratio may be about 0.05 or more. For example, the 2D/G intensity ratio may be about 0.1 or more. The 2D/G intensity ratio may be about 1 or less.

Figure 17:
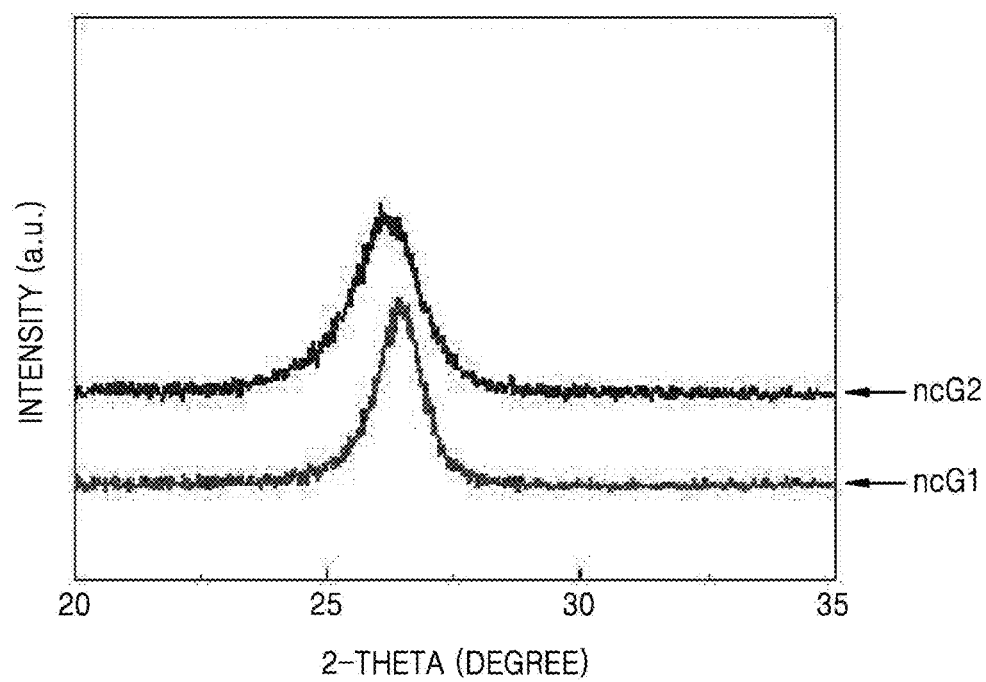
FIG. 17 is a graph showing a result of X-ray diffraction analysis of nanocrystalline graphenes, according to embodiments.

FIG. 17 is a graph showing a result of X-ray diffraction analysis of nanocrystalline graphenes, according to embodiments. In the graph of FIG. 17, $2\theta$ or the like at which the peak appears may be obtained. By using this information, an interlayer spacing (e.g., d-spacing (d002)) of the nanocrystalline graphene may be calculated. A d-spacing of the nanocrystalline graphene may be greater than about 3.35 Å. For example, the d-spacing of the nanocrystalline graphene may be 3.4 Å or more.

The nanocrystalline graphene, which may be included in the pellicle membrane (M10 in FIGS. 1 to 3), has been illustrated and described in FIGS. 12 to 17, but the pellicle membrane M10 may include graphene other than the nanocrystalline graphene, or may include rGO, CNT, fullerene, amorphous carbon, or the like. The graphene other than the nanocrystalline graphene may be monocrystalline graphene or polycrystalline graphene. The monocrystalline graphene or the polycrystalline graphene may have thermal conductivity (in-plane thermal conductivity) of several thousands of W/m·k, a Young's modulus of several hundreds of GPa or more, and a tensile strength of several tens of GPa or more, and may have a transmittance of about 80% or more, or about 90% or more, with respect to EUV light at a thickness of several tens of nm. Also, the monocrystalline graphene or the polycrystalline graphene may have excellent durability and stability. In this regard, the monocrystalline graphene or the polycrystalline graphene may also have excellent characteristics as a material of the pellicle membrane, in terms of various aspects.

Figure 18:
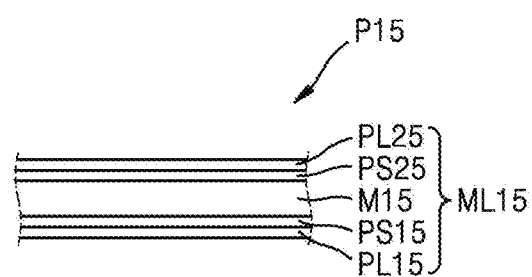
FIG. 18 is a cross-sectional view of a pellicle for a photomask, according to some example embodiments.

FIG. 18 is a cross-sectional view of a pellicle P15 for a photomask, according to some example embodiments.

Referring to FIG. 18, the pellicle P15 may include a pellicle membrane M15. The pellicle membrane M15 may include a carbon-based material. The carbon-based material may include a 2D carbon structure or a carbon-based nanomaterial. For example, the carbon-based material may include at least one selected from graphene, nanocrystalline graphene, rGO, CNT, fullerene, and amorphous carbon.

The pellicle P15 may include at least one of passivation members PS15 and PS25 on at least one surface of the pellicle membrane M15. FIG. 18 illustrates a case where the first passivation member PS15 is disposed on a lower surface of the pellicle membrane M15, and the second passivation member PS25 is disposed on an upper surface of the pellicle membrane M15. Each of the passivation members PS15 and PS25 may include an inorganic material. For example, the inorganic material may include at least one selected from a metal, an oxide, a nitride, a semiconductor, and a metal chalcogenide-based material. The first and second passivation members PS15 and PS25 may correspond to the first and second passivation members PS10 and PS20 of FIG. 1, respectively.

The pellicle P15 according to the present embodiment may further include at least one of a first protective layer PL15 disposed on a surface of the first passivation member PS15 and a second protective layer PL25 disposed on a surface of the second passivation member PS25. The first passivation member PS15 may be disposed between the first protective layer PL15 and the pellicle membrane M15. The second passivation member PS25 may be disposed between the second protective layer PL25 and the pellicle membrane M15. The first protective layer PL15 and the first passivation member PS15 may include different materials or similar or identical materials. Similarly, the second protective layer PL25 and the second passivation member PS25 may include different materials or similar or identical materials. At least one of the first and second protective layers PL15 and PL25 may include an inorganic material, and the inorganic material may be identical or similar to the inorganic material of the passivation member PS15 or PS25. Also, at least one of the first and second protective layers PL15 and PL25 may include at least one selected from a metal chalcogenide-based material, a silicon derivative, and a metal oxide. The metal chalcogenide-based material may include, for example, a transition metal dichalcogenide (TMD). As a specific example, the metal chalcogenide-based material may include one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. When the first and second protective layers PL15 and PL25 include the metal chalcogenide-based material, excellent uniformity and transmittance may be secured. In particular, the TMD may have a surface roughness of several nanometers or less and may have a high transmittance of about 90% or more with respect to EUV light. Also, the first and second protective layers PL15 and PL25 may include other materials except for the metal chalcogenide-based material. For example, the first and second protective layers PL15 and PL25 may include a silicon derivative or a metal oxide. The silicon derivative may include, for example, at least one selected from the group consisting of Si, $SiO_x$, and $Si_xN_y$. $SiO_x$ may be $SiO_2$, and $Si_xN_y$ may be $Si_3N_4$. The metal oxide may include, for example, at least one metal element selected from the group consisting of Hf, Al, Mg, Zr, Cu, Ni, Zn, and Ti, and an oxygen (O) atom. Also, the first and second protective layers PL15 and PL25 may include a metal, a metallic compound, or a 2D material. The pellicle membrane M15, the first and second passivation members PS15 and PS25, and the first and second protective layers PL15 and PL25 may constitute a membrane layer ML15. The pellicle P15 may not include at least one of the first and second protective layers PL15 and PL25.

Figure 19:
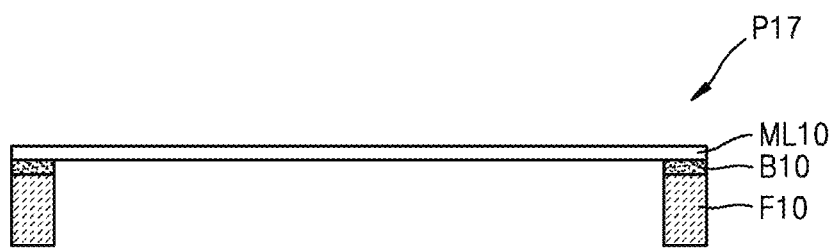
FIG. 19 is a cross-sectional view of a pellicle for a photomask, according to some example embodiments.

FIG. 19 is a cross-sectional view of a pellicle P17 for a photomask, according to some example embodiments.

Referring to FIG. 19, the pellicle P17 may further include a bonding layer B10 between a membrane layer ML10 and a frame F10. Although the membrane layer ML10 is simply illustrated for convenience, the membrane layer ML10 may have substantially the same configuration as those of the membrane layers ML10 to ML12 and ML15 described above with reference to FIGS. 1 to 3 and 18, or may have a configuration modified therefrom. The bonding layer B10 may more tightly bond the membrane layer ML10 to the frame F10. Various materials used as adhesive or bonding materials in the fields of general semiconductor devices and electronic circuits may be applied as the material of the bonding layer B10. FIG. 19 illustrates a case where the bonding layer B10 is provided in the structure of FIG. 1, but the bonding layer B10 may also be provided in the structures of FIGS. 2, 3, and 18.

Figure 20:
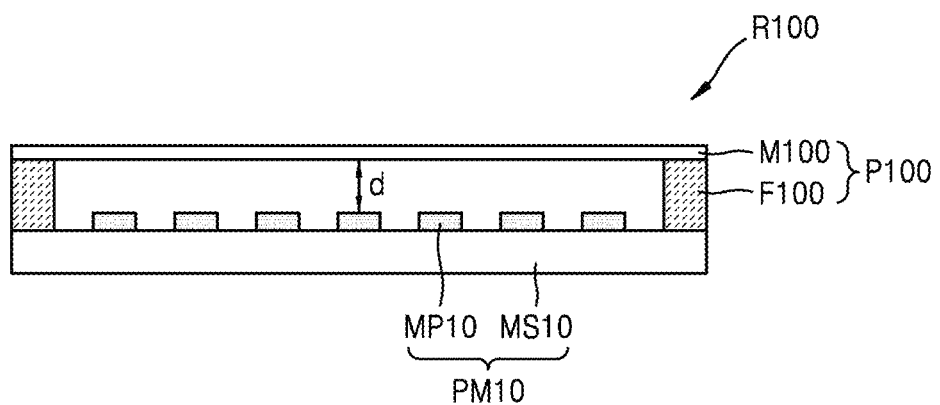
FIG. 20 is a cross-sectional view of a reticle including a pellicle for a photomask, according to some example embodiments.

FIG. 20 is a cross-sectional view of a reticle R100 including a pellicle P100 for a photomask PM10, according to some example embodiments.

Referring to FIG. 20, the reticle R100 may include the photomask PM10, and the pellicle P100 configured to protect the photomask PM10. The photomask PM10 may include a mask substrate MS10, and a mask pattern MP10 on the mask substrate MS10. A shape, size, and interval of the mask pattern MP10 are merely examples, and may be variously changed.

The pellicle P100 may include a membrane layer M100 spaced apart from the mask pattern MP10. Although the membrane layer M100 is simply illustrated for convenience, the membrane layer M100 may have substantially the same configuration as those of the membrane layers ML10 to ML12 and ML15 described above with reference to FIGS. 1 to 3 and 18, or may have a configuration modified therefrom. The membrane layer M100 may have a first horizontal length of several tens of mm to several hundreds of mm and a second horizontal length (width) of several tens of mm to several hundreds of mm. The membrane layer M100 may have a thickness of about 150 nm or less, or about 100 nm or less. For example, the membrane layer M100 may have a thickness of about 70 nm or less, or about 50 nm or less.

The pellicle P100 may further include a frame F100 disposed at an edge portion of the mask pattern MP10 to support the membrane layer M100. Due to the frame F100, the photomask PM10 and the membrane layer M100 may be spaced apart from each other by a certain internal d. In other words, due to the frame F100, the mask pattern MP10 of the photomask PM10 and the membrane layer M100 may be spaced apart from each other by a certain internal d. The interval d may be about 15 mm or less. For example, the interval d may be about 1 mm to about 10 mm. Although not illustrated, a bonding layer may be further provided between the membrane layer M100 and the frame F100. Also, a bonding layer may be further provided between the frame F100 and the photomask PM10.

The pellicle P100 may protect the photomask PM10 from external contaminants (for example, dust, resist, or the like). When the pellicle P100 is absent, foreign substances may be attached to the photomask PM10, causing various problems in the lithography process. Details thereof will be described below with reference to FIG. 21.

Figure 21:
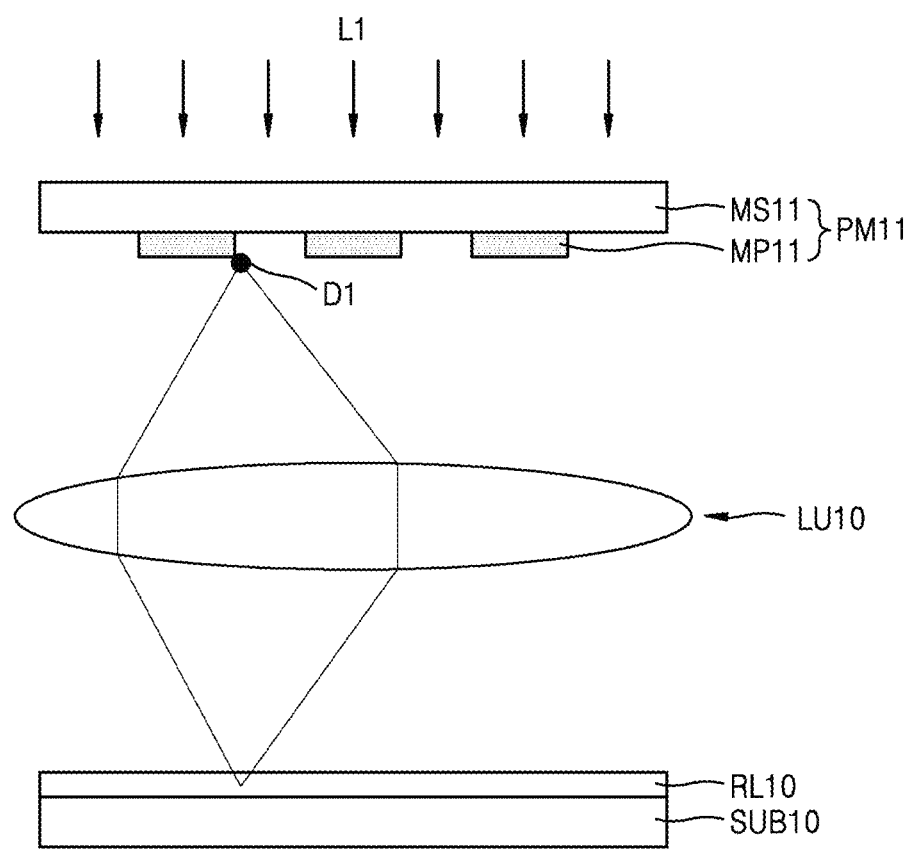
FIG. 21 is a diagram for describing a problem caused by foreign substances when a lithography process is performed by using a photomask without a pellicle.

FIG. 21 is a diagram for describing a problem caused by foreign substances D1 when a lithography process is performed by using a photomask PM11 without a pellicle.

Referring to FIG. 21, when the lithography process is performed by using the photomask PM11 without a pellicle, the foreign substances D1 may be directly attached to the photomask PM11. The photomask PM11 may include a mask substrate MS11 and a mask pattern MP11, and the foreign substances D1 may be directly attached to the mask pattern MP11.

Light L1 generated by a light source (not illustrated) may pass through the photomask PM11 and a lens unit LU10, and a resist layer RL10 of a substrate SUB10 may be exposed to the light L1. Through such an exposure process, a pattern corresponding to the mask pattern MP11 may be transferred onto the resist layer RL10. However, when the foreign substances D1 are directly attached to the mask pattern MP11 or a region of the mask substrate MS11 exposed by the mask pattern MP11, the foreign substances D1 may have a direct influence on patterning of the resist layer RL10. That is, light passing through the foreign substances D1 may be focused on the resist layer RL10. Due to this, an unintended region of the resist layer RL10 may be exposed. Consequently, patterns having a desired (intended) shape may not be realized on the resist layer RL10. In particular, as a width (line width) of a pattern to be formed becomes narrower, the influence of the foreign substances D1 may further increase.

Figure 22:
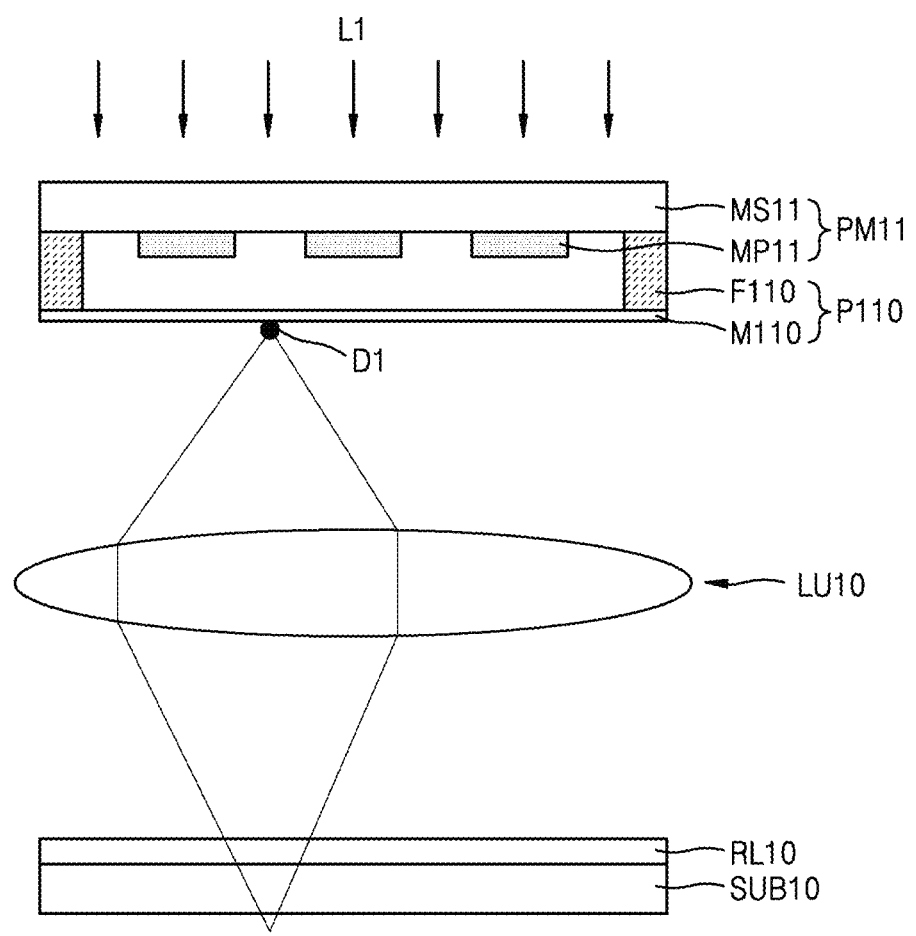
FIG. 22 is a diagram for describing how the influence of foreign substances is removed by a pellicle when a lithography process is performed in a state in which a photomask is protected by the pellicle.

FIG. 22 is a diagram for describing how the influence of foreign substances D1 is removed by a pellicle P110 when a lithography process is performed in a state in which a photomask PM11 is protected by the pellicle P110. For example, FIG. 22 illustrates a case where the lithography process is performed in a state in which the photomask PM11 illustrated in FIG. 21 is protected by the pellicle P110. The pellicle P110 may include a membrane layer M110 and a frame F110 and may correspond to the pellicle P100 of FIG. 20.

Referring to FIG. 22, when the pellicle P110 protects the photomask PM11, the foreign substances D1 may be attached to the outside of the pellicle P110. For example, the foreign substances D1 may be attached to the outer surface of the membrane layer M110. Thus, the foreign substances D1 may be spaced apart from the mask pattern MP11 by a certain interval. In this case, the foreign substances D1 may have no or almost no influence on patterning of the resist layer RL10. Light passing through the foreign substances D1 may not be focused on the resist layer RL10 and may be focused on a region except for the resist layer RL10. In other words, light passing through the foreign substances D1 may be defocused on the resist layer RL10. Therefore, the foreign substances D1 may have no influence on patterning of the resist layer RL10. As such, when the pellicle P110 is used, the influence of the foreign substances D1 may be removed when the lithography process is performed.

The interval between the photomask PM11 and the membrane layer M110 may be determined within an appropriate range. For example, the membrane layer M110 may be spaced apart from the photomask PM11 by a certain interval or more. Also, the interval may be determined by taking into account the wavelength band of the light L1 used in the lithography process or other conditions.

In FIGS. 21 and 22, it is assumed that the photomask PM11 is a transmissive photomask. However, even when the photomask PM11 is a reflective photomask, the effects described with reference to FIGS. 21 and 22 may similarly appear. Also, the lens unit LU10 is simply illustrated in FIGS. 21 and 22 but in practice, a lens unit or a lens system having a more complicated configuration may be used.

Hereinafter, a lithography apparatus (e.g., an exposure apparatus for lithography), to which a reticle including a pellicle is applied, according to some example embodiments will be described with reference to FIGS. 23 to 25.

Figure 23:
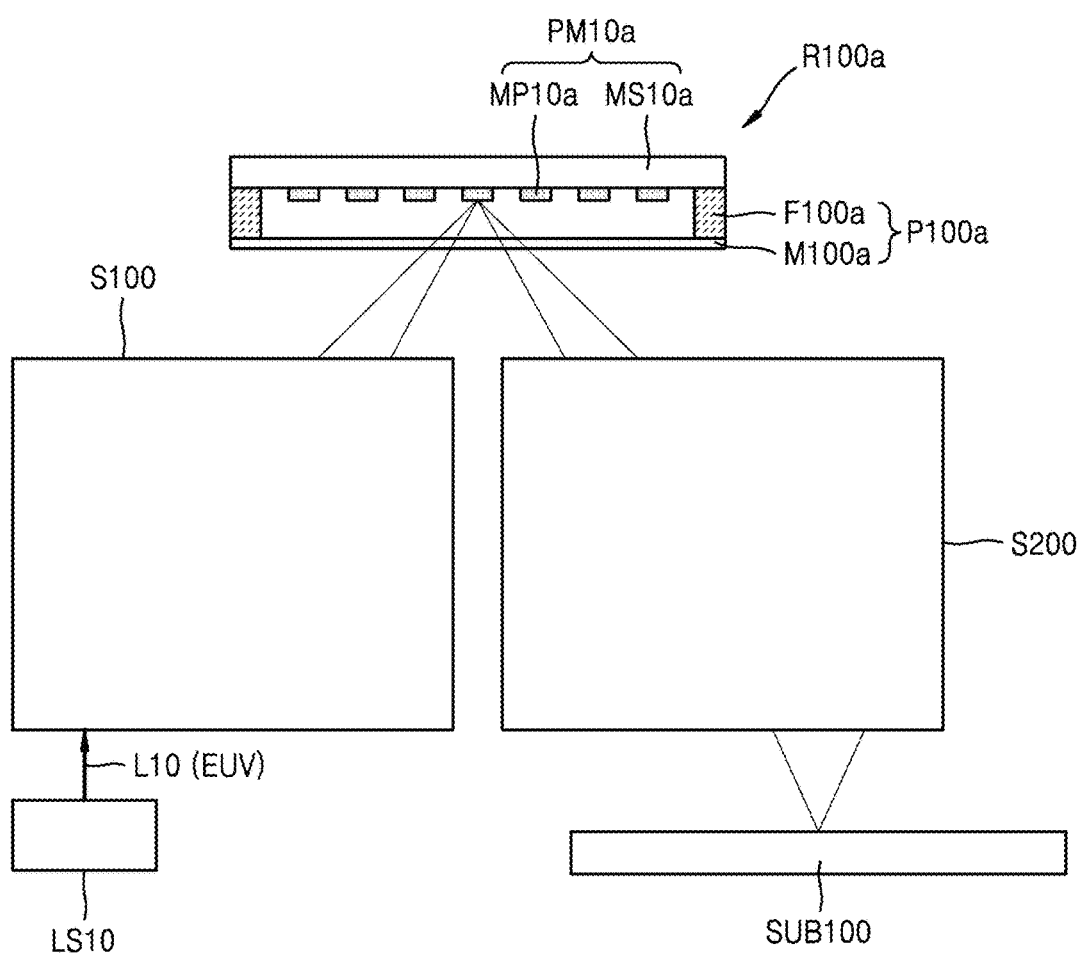
FIG. 23 is a diagram illustrating an exposure apparatus for lithography, to which a reticle including a pellicle is applied, according to some example embodiments.

FIG. 23 is a diagram illustrating an exposure apparatus for lithography, to which a reticle R100a including a pellicle P100a is applied, according to some example embodiments.

Referring to FIG. 23, the reticle R100a may be a reflective reticle. The reticle R100a may include a photomask PM10a and the pellicle P100a configured to protect the photomask PM10a. The photomask PM10a may include a mask substrate MS10a and a mask pattern MP10a, and the pellicle P100a may include a membrane layer M100a and a frame F100a. The reticle R100a may correspond to the reticle R100 described with reference to FIG. 20. The mask substrate MS10a may have characteristics that reflect light of a certain wavelength region, and the mask pattern MP10a may have characteristics that absorb the light of the certain wavelength region.

Light L10 generated by a light source LS10 may pass through the reticle R100a and be irradiated onto a substrate SUB100. The light L10 may be EUV light. The EUV light may have a wavelength of about 13.3 nm to about 13.5 nm, or about 13.3 nm or less. The mask substrate MS10a of the reticle R100a may have characteristics that reflect EUV light, and the mask pattern MP10a may have characteristics that absorb EUV light. The light reflected from the reticle R100a may be incident on the substrate SUB100. The substrate SUB100 may include a region (layer) to be patterned. For example, the substrate SUB100 may be a wafer including a certain resist layer (not illustrated). The light reflected from the reticle R100a may be focused on the resist layer (not illustrated) of the substrate SUB100. Consequently, a pattern of the mask pattern MP10a may be transferred onto the substrate SUB100.

At least one optical member may be provided between the light source LS10 and the reticle R100a and/or between the reticle R100a and the substrate SUB100. For example, a first optical system S100 may be provided between the light source LS10 and the reticle R100a, and a second optical system S200 may be provided between the reticle R100a and the substrate SUB100. The first optical system S100 may be an "illumination optical system." For example, the first optical system S100 may include at least one collimating lens and/or an alignment optical system. The light source LS10 may be included in the illumination optical system S100. The second optical system S200 may be a "projection optical system." For example, the second optical system S200 may include at least one reflection member and/or at least one lens. The configurations of the first optical system S100 and the second optical system S200 may be variously changed. In some example embodiments, the lithography process (exposure process) may be performed while moving the reticle R100a in a horizontal direction and/or moving the substrate SUB100 in a horizontal direction.

Figure 24:
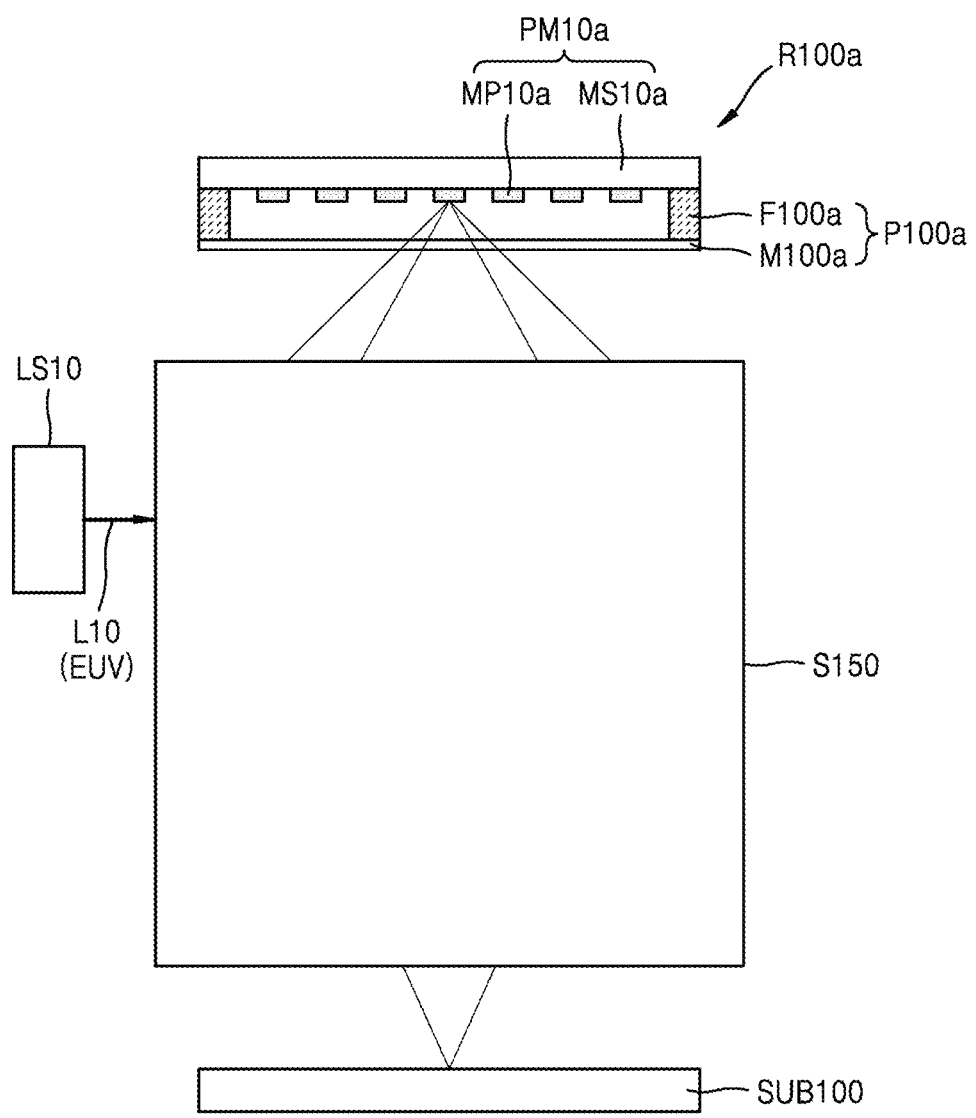
FIG. 24 is a diagram illustrating an exposure apparatus for lithography, to which a reticle including a pellicle is applied, according to some example embodiments.

FIG. 24 is a diagram illustrating an exposure apparatus for lithography, to which a reticle R100a including a pellicle P100a is applied, according to some example embodiments. FIG. 26 illustrates another example in which a reflective reticle R100a is used.

Referring to FIG. 24, light L10 generated by a light source LS10 may pass through the reticle R100a and be irradiated onto a substrate SUB100. The reticle R100a may be provided within a traveling path of the light L10. An optical system S150 may be provided between the reticle R100a and the substrate SUB100. After the light L10 generated by the light source LS10 passes through the optical system S150 and is irradiated onto the reticle R100a, the light reflected from the reticle R100a may pass through the optical system S150 again and be then incident on the substrate SUB100. The optical system S150 may have both the function of the first optical system S100 and the function of the second optical system S200. In other words, the optical system S150 may have both the configuration of the illumination optical system and the configuration of the projection optical system. In some example embodiments, the lithography process (exposure process) may be performed while moving the reticle R100a in a horizontal direction and/or moving the substrate SUB100 in a horizontal direction.

Figure 25:
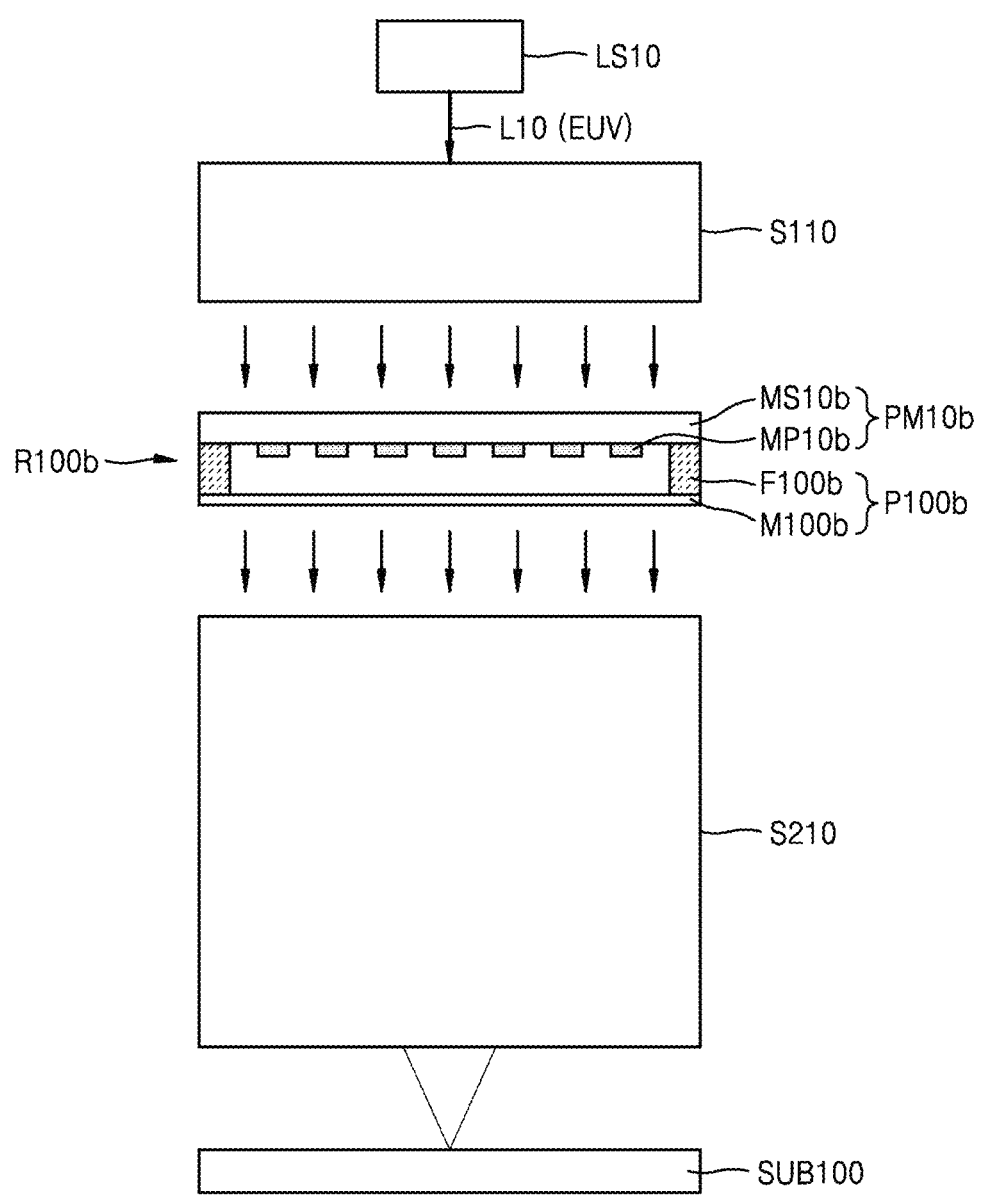
FIG. 25 is a diagram illustrating an exposure apparatus for lithography, to which a reticle including a pellicle is applied, according to some example embodiments.

FIG. 25 is a diagram illustrating an exposure apparatus for lithography, to which a reticle R100b including a pellicle P100b is applied, according to some example embodiments. FIG. 26 illustrates an example in which a transmissive reticle R100b is used.

Referring to FIG. 25, the exposure apparatus may include a light source LS10 configured to generate light L10. The light L10 may be EUV light. The reticle R100b may be provided within a traveling path of the light L10. The reticle R100b may be a transmissive reticle R100b. In this case, the reticle R100b may include a transmissive photomask PM10b and the photomask PM10b may include a mask substrate MS10b and a mask pattern MP10b. The mask substrate MS10b may have characteristics that transmit the light L10, and the mask pattern MP10b may have characteristics that absorb or reflect the light L10. The reticle R100b may include the pellicle P100b configured to protect the photomask PM10b and the pellicle P100b may include a membrane layer M100b and a frame F100b. The pellicle P100b may have the same structure as those described with reference to FIGS. 1 to 3, 18, and 19.

The light L10 generated by the light source LS10 may pass through the reticle R100b and be irradiated onto a substrate SUB100. Consequently, an exposure process may be performed on a resist layer (not illustrated) of the substrate SUB100. At least one optical member may be provided between the light source LS10 and the reticle R100b and/or between the reticle R100b and the substrate SUB100. For example, a first optical system S110 may be provided between the light source LS10 and the reticle R100b. Also, a second optical system S210 may be provided between the reticle R100b and the substrate SUB100. The first optical system S110 may be an illuminating optical system, and the second optical system S210 may be a projection optical system. The configurations of the first optical system S110 and the second optical system S210 may be similar to the configurations of the first optical system S100 and the second optical system S200 illustrated in FIG. 23, respectively. In some example embodiments, the lithography process (exposure process) may be performed while moving the reticle R100b in a horizontal direction and/or moving the substrate SUB100 in a horizontal direction.

FIG. 25 illustrates a case where the lithography process is performed in a state in which the pellicle P100b is disposed under the photomask PM10b but in some cases, the lithography process may be performed in a state in which the pellicle P100b is disposed above the photomask PM10b. In other words, in FIG. 25, the lithography process may be performed in a state in which the reticle R100b is upside down.

The reticles R100a and R100b may be repeatedly used in the lithography apparatuses (exposure apparatuses for lithography) illustrated in FIGS. 23 to 25. When the number of uses of the reticles R100a and R100b is equal to or greater than a certain threshold value, the life of the pellicles P100a and P100b may be expired. The expired pellicles P100a and P100b may be replaced with new pellicles, or the reticles R100a and R100b themselves may be replaced with new reticles. Since the pellicles P100a and P100b according to embodiments have excellent durability, light resistance, and stability, the pellicles P100a and P100b may be used for long periods of time. Also, since the pellicles P100a and P100b have high transmittance and excellent uniformity, it is possible to improve uniformity and precision of the lithography process.

A case where the pellicles P100a and P100b according to embodiments are used for EUV lithography has been illustrated and described above, but in some cases, the pellicles P100a and P100b may be used in a lithography process using light of another wavelength region, except for EUV light. For example, the pellicles P100a and P100b may be used for deep ultraviolet (DUV) light or light of other wavelength regions.

It will be understood by those of ordinary skill in the art that the configurations of the pellicles for a photomask described with reference to FIGS. 1 to 3, 18, and 19 may be variously changed, and the configurations of the reticles and lithography apparatuses described with reference to FIGS. 20 to 25 may be variously modified.

FIGS. 26A to 26E illustrate a method of forming a pattern using a patterning process according to some example embodiments.

Figure 26A:
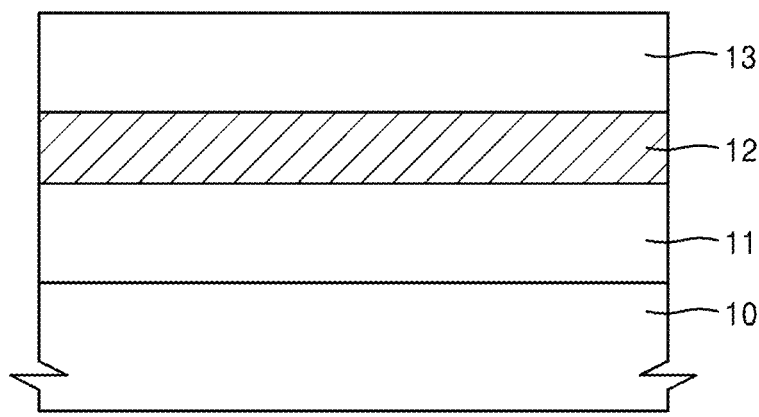
FIGS. 26A to 26E illustrate a method of forming a pattern using a patterning process according to some example embodiments.

Referring to FIG. 26A, an etching layer 11 may be formed on a substrate 10. A hardmask 12 may be formed on the etching layer 11.

In some example embodiments, the hardmask 12 may include an organic hardmask. In other example embodiments, the hardmask 12 may include an inorganic hardmask (e.g., SiON, $SiO_2$). Although not illustrated, a capping layer may be formed on the hardmask. A process of providing the hardmask 12 may include at one of spin coating, air spraying, electrospraying, dip coating, spray coating, doctor blade coating, and bar coating. However, inventive concepts are not limited thereto and other deposition processes such as chemical vapor deposition (CVD), plasma-enhanced CVD, and/or sputtering processes may be used to provide the hardmask.

The substrate 10 is not particularly limited. For example, the substrate 10 may be at least one selected from a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 may be formed on the hardmask 12.

Figure 26B:
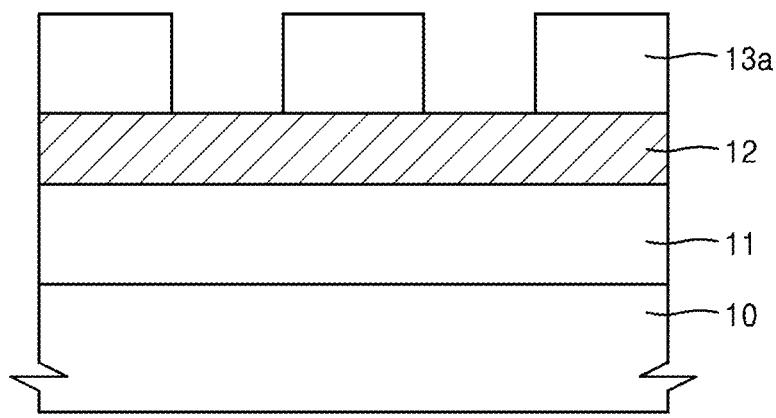

As shown in FIG. 26B, a photoresist pattern 13a may be formed by exposing the photoresist layer 13 and then developing photoresist layer 13. The photoresist layer 13 may be exposed using one of the exposure apparatuses described above in FIGS. 23 to 25. After the exposing process, heat treatment may be performed on the exposed photoresist layer 13.

In the developing process, a developing solution, e.g., an aqueous solution of tetramethylammonium hydroxide (TMAH), may be used.

Figure 26C:
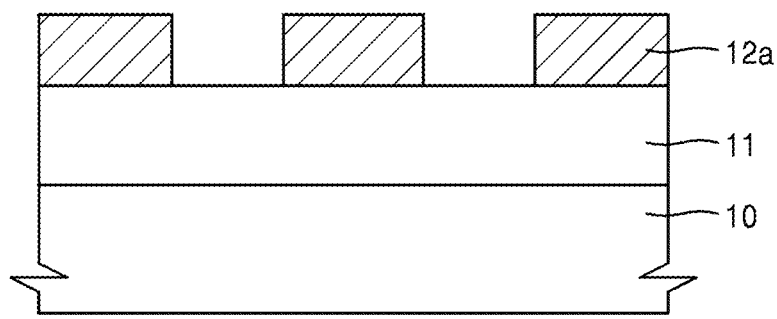

Subsequently, the hardmask 12 may be etched using the photoresist pattern 13a as an etching mask to form a hardmask pattern 12a on the etching layer 11 (FIG. 26C).

For example, the etching process may be performed using a dry etching method using an etching gas. Examples of the etching gas include at least one selected from $CF_4$, $CHF_3$, $C_2F_6$, $C_4F_8$, $CHF_3$, $Cl_2$, and $BCl_3$.

The etching layer 11 may be formed as a plurality of patterns. The plurality of patterns may vary, for example, a metal pattern, a semiconductor pattern, and an insulator pattern. For example, the plurality of patterns may be various patterns applied to a semiconductor integrated circuit device.

The etching layer 11 may contain a material that is to be finally patterned. The material of the etching layer 11 may be, for example, a metal (e.g., aluminum or copper), a semiconductor (e.g., silicon), or an insulator (e.g., silicon oxide or silicon nitride). The etching layer 11 may be formed using various methods (e.g., sputtering, electronic beam deposition, chemical vapor deposition, and physical vapor deposition). For example, the etching layer 11 may be formed using a chemical vapor deposition method.

Figure 26D:
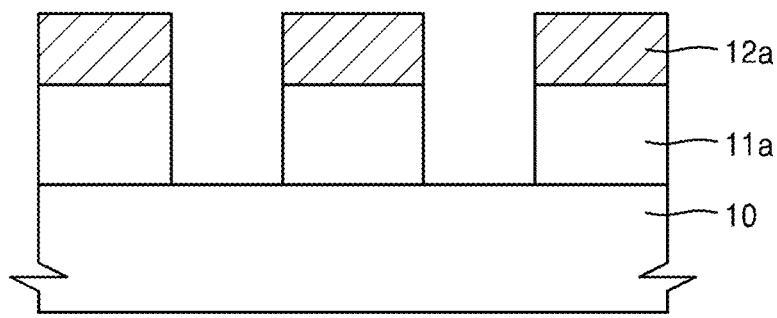
Figure 26E:
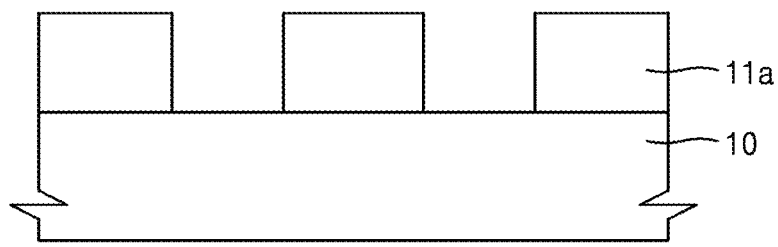

As shown in FIGS. 26D and 26E, the etching layer 11 may be etched using the hardmask pattern 12a as an etching mask to later form an etching layer pattern 11a having a desired fine pattern.

In some example embodiments, the hardmask 12 may be omitted and the photoresist pattern 13a may be formed directly on the etching layer 11. In which case, the etching layer 11 may be used using the photoresist pattern 13a as an etching mask to form the etching layer pattern 11a.

Figure 26F:
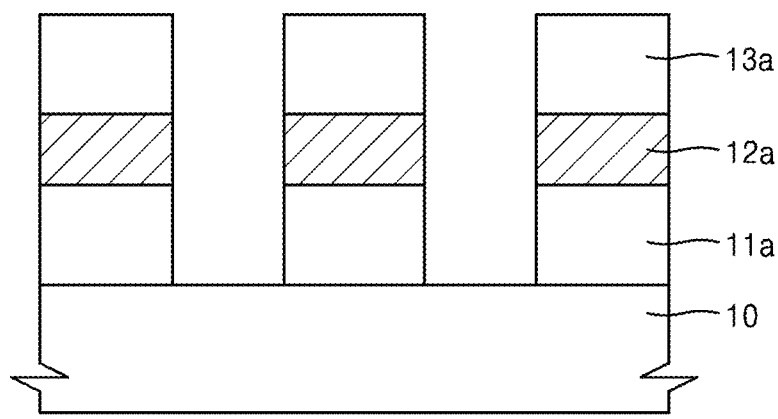
FIG. 26F illustrates a part of a method of forming a pattern using a patterning process according to some example embodiments.

FIG. 26F illustrates a part of a method of forming a pattern using a patterning process according to some example embodiments.

Referring to FIG. 26F, a photoresist pattern 13a may be formed on a hard mask 12, etching layer 11, and substrate 10 according to the same operations described above in FIGS. 26A and 26B. Then, a hardmask pattern 12a and etching layer 11 pattern 11a may be formed by etching the hardmask 12 and the etching layer 11 using the photoresist pattern 13a as an etching mask.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of inventive concepts, as defined by the following claims.

What is claimed is:

1. A pellicle for protecting a photomask, the pellicle comprising:

a pellicle membrane including a carbon-based material, the carbon-based material having defects; and a passivation member covering the defects of the carbon-based material, the passivation member including an inorganic material, wherein the pellicle membrane and the passivation member each have a transmittance of about 80% or more with respect to extreme ultraviolet (EUV) light, wherein the carbon-based material includes nanocrystalline graphene, and wherein the nanocrystalline graphene includes at least one of:

an amount of oxygen (O) in a range of about 1 at % to about 20 at %;

an amount of hydrogen (H) in a range of about 1 at % to about 20 at %; or an amount of nitrogen (N) in a range of about 1 at % to about 20 at %.

2. The pellicle of claim 1, wherein the defects of the carbon-based material include at least one of a grain boundary, a vacancy, an sp3 carbon (C) atom, an oxygen (O) atom, or a nitrogen (N) atom.

3. The pellicle of claim 1, wherein the defects of the carbon-based material include at least one of a grain boundary or a vacancy.

4. The pellicle of claim 1, wherein a D/G intensity ratio in a Raman spectrum of the nanocrystalline graphene is about 0.5 or more, and a 2D/G intensity ratio in the Raman spectrum of the nanocrystalline graphene is about 0.05 or more, wherein G is a peak appearing at 1,580 cm-1, D is a peak appearing in a range of 1,340 $cm^{-1}$ to 1,350 $cm^{-1}$ and 2D is a peak appearing at 2,700 $cm^{-1}$ in the Raman spectrum.

5. The pellicle of claim 1, wherein the passivation member includes a plurality of dot elements, and the plurality of dot elements selectively cover the defects of the carbon-based material.

6. The pellicle of claim 1, wherein the passivation member has a thin film structure.

7. The pellicle of claim 1, wherein the passivation member is disposed on at least one of an upper surface of the pellicle membrane or a lower surface of the pellicle membrane.

8. The pellicle of claim 1, wherein the inorganic material of the passivation member includes at least one of a metal, an oxide, a nitride, a semiconductor, or a metal chalcogenide-based material.

9. The pellicle of claim 8, wherein the metal includes at least one selected from Mo, Ti, or Ru, the oxide includes $MoO_x$, the nitride includes at least one of TiN or $SiN_x$, the semiconductor includes at least one of Ge or $ZrSi_2$, and the metal chalcogenide-based material includes a transition metal chalcogenide.

10. The pellicle of claim 1, wherein the passivation member has a thickness within about 20% of a thickness of the pellicle membrane.

11. The pellicle of claim 1, wherein the passivation member has a thickness of greater than 0 nm and less than or equal to about 20 nm.

12. The pellicle of claim 1, wherein the pellicle membrane has a thickness of greater than 0 nm and less than or equal to about 100 nm.

13. The pellicle of claim 1, wherein the pellicle membrane is spaced apart from the photomask by about 1 mm to about 10 mm.

14. The pellicle of claim 1, further comprising:
a pellicle frame on an edge portion of the pellicle membrane.

15. The pellicle of claim 14, further comprising:
a bonding layer between the pellicle membrane and the pellicle frame.

16. A reticle comprising:
the photomask; and
the pellicle of claim 1, wherein the pellicle is connected to the photomask and configured to protect the photomask.

17. The reticle of claim 16, wherein the reticle is a transmissive reticle.

18. The reticle of claim 16, wherein the reticle is a reflective reticle.

19. The reticle of claim 16, wherein the reticle is a reticle for extreme ultraviolet (EUV) lithography.

20. An exposure apparatus for lithography, comprising:
a light source configured to generate light; and
the reticle of claim 16, wherein
the reticle is in a traveling path of the light generated by the light source.

21. The exposure apparatus of claim 20, further comprising at least one of:
a first optical member between the reticle and the light source; or
a second optical member between the reticle and a substrate.

22. The exposure apparatus of claim 20, wherein the exposure apparatus is an extreme ultraviolet (EUV) exposure apparatus.

23. A pellicle for protecting a photomask, the pellicle comprising:
a pellicle membrane including a carbon-based material, the carbon-based material having defects;
a frame supporting the pellicle membrane; and
a passivation member on top of at least one of the frame and the pellicle membrane, the passivation member covering the defects of the carbon-based material, the passivation member including an inorganic material,
wherein the pellicle membrane and the passivation member each have a transmittance of about 80% or more with respect to extreme ultraviolet (EUV) light,
wherein the carbon-based material includes nanocrystalline graphene, and
wherein the nanocrystalline graphene includes at least one of:
an amount of oxygen (O) in a range of about 1 at % to about 20 at %;
an amount of hydrogen (H) in a range of about 1 at % to about 20 at %; or
an amount of nitrogen (N) in a range of about 1 at % to about 20 at %.

24. The pellicle of claim 23, wherein
the passivation member includes a first passivation layer and a second passivation layer,
the first passivation layer is between the frame and the pellicle membrane, and
the second passivation layer is on top of the pellicle membrane and the frame.

25. The pellicle of claim 23, wherein the inorganic material includes at least one of Mo, Ti, Ru, $MoO_x$, TiN, $SiN_x$, Ge, $ZrSi_2$, or a transition metal chalcogenide.

26. A reticle comprising:
the photomask; and
the pellicle of claim 23, wherein the pellicle is connected to the photomask and configured to protect the photomask.

27. A pellicle for protecting a photomask, the pellicle comprising:
a pellicle membrane including a carbon-based material, the carbon-based material having defects; and
a passivation member covering the defects of the carbon-based material, the passivation member including an inorganic material,
wherein the passivation member includes a plurality of dot elements, and the plurality of dot elements selectively cover the defects of the carbon-based material.

28. A pellicle for protecting a photomask, the pellicle comprising:
a pellicle membrane including a carbon-based material, the carbon-based material having defects; and
a passivation member covering the defects of the carbon-based material, the passivation member including an inorganic material,
wherein the carbon-based material includes nanocrystalline graphene, and a D/G intensity ratio in a Raman spectrum of the nanocrystalline graphene is about 0.5 or more, and a 2D/G intensity ratio in the Raman spectrum of the nanocrystalline graphene is about 0.05 or more, and
wherein G is a peak appearing at 1,580 $cm^{-1}$, D is a peak appearing in a range of 1,340 $cm^{-1}$ to 1,350 $cm^{-1}$ and 2D is a peak appearing at 2,700 $cm^{-1}$ in the Raman spectrum.

* * * * *